(12) United States Patent  
Chang et al.

(10) Patent No.: US 10,700,208 B2  
(45) Date of Patent: Jun. 30, 2020

(54) SEMICONDUCTOR DEVICE AND METHODS OF MANUFACTURE

(71) Applicant: Taiwan Semiconductor Manufacturing Company, Ltd., Hsinchu (TW)

(72) Inventors: Che-Cheng Chang, New Taipei (TW); Kai-Yu Cheng, New Taipei (TW); Chih-Han Lin, Hsinchu (TW); Sin-Yi Yang, Taichung (TW); Horng-Huei Tseng, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 16/224,062

(22) Filed: Dec. 18, 2018

(65) Prior Publication Data

US 2019/0148553 A1    May 16, 2019

Related U.S. Application Data

(63) Continuation of application No. 15/394,362, filed on Dec. 29, 2016, now Pat. No. 10,164,111.

(60) Provisional application No. 62/405,700, filed on Oct. 7, 2016, provisional application No. 62/370,564, filed on Aug. 3, 2016.

(51) Int. Cl.
| | |
|---|---|
| *H01L 29/78* | (2006.01) |
| *H01L 29/417* | (2006.01) |
| *H01L 21/768* | (2006.01) |
| *H01L 29/66* | (2006.01) |

(52) U.S. Cl.
CPC .... *H01L 29/7851* (2013.01); *H01L 21/76879* (2013.01); *H01L 29/41791* (2013.01); *H01L 29/66795* (2013.01); *H01L 29/785* (2013.01)

(58) Field of Classification Search
CPC ............. H01L 27/0886; H01L 27/1211; H01L 29/41791; H01L 29/785
See application file for complete search history.

(56) References Cited

U.S. PATENT DOCUMENTS

| | | | |
|---|---|---|---|
| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,436,473 | B2 | 5/2013 | Chen et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |

(Continued)

FOREIGN PATENT DOCUMENTS

CN    102194792 B    11/2012

*Primary Examiner* — Jae Lee  
(74) *Attorney, Agent, or Firm* — Slater Matsil, LLP

(57) ABSTRACT

A semiconductor device and method of manufacture are provided. In an embodiment a first contact is formed to a source/drain region and a dielectric layer is formed over the first contact. An opening is formed to expose the first contact, and the opening is lined with a dielectric material. A second contact is formed in electrical contact with the first contact through the dielectric material.

20 Claims, 22 Drawing Sheets

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,397,008 B1 | 7/2016 | Tung et al. |
| 2012/0003800 A1* | 1/2012 | Lee .................. H01L 27/11551 438/261 |
| 2013/0049219 A1* | 2/2013 | Tsai .................. H01L 21/28518 257/774 |
| 2014/0001574 A1 | 1/2014 | Chen et al. |
| 2014/0110755 A1 | 4/2014 | Colinge |
| 2014/0151812 A1 | 6/2014 | Liaw |
| 2016/0379925 A1 | 12/2016 | Ok et al. |
| 2017/0103981 A1 | 4/2017 | Hung et al. |
| 2017/0162694 A1 | 6/2017 | Basker et al. |
| 2017/0170290 A1 | 6/2017 | Basker et al. |
| 2017/0278747 A1* | 9/2017 | Adusumilli ....... H01L 21/76897 |
| 2017/0345912 A1* | 11/2017 | Kim ................ H01L 29/665545 |

\* cited by examiner

SEMICONDUCTOR DEVICE AND METHODS OF MANUFACTURE

PRIORITY

This application is a continuation of U.S. patent application Ser. No. 15/394,362, filed on Dec. 29, 2016, entitled "Semiconductor Device and Methods of Manufacture," which claims priority to and the benefit of U.S. Provisional Application No. 62/370,564, filed on Aug. 3, 2016, entitled "Etch Process and Resulting Structures," and U.S. Provisional Application No. 62/405,700, filed on Oct. 7, 2016, entitled "Semiconductor Device and Methods of Manufacture," which applications are hereby incorporated herein by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
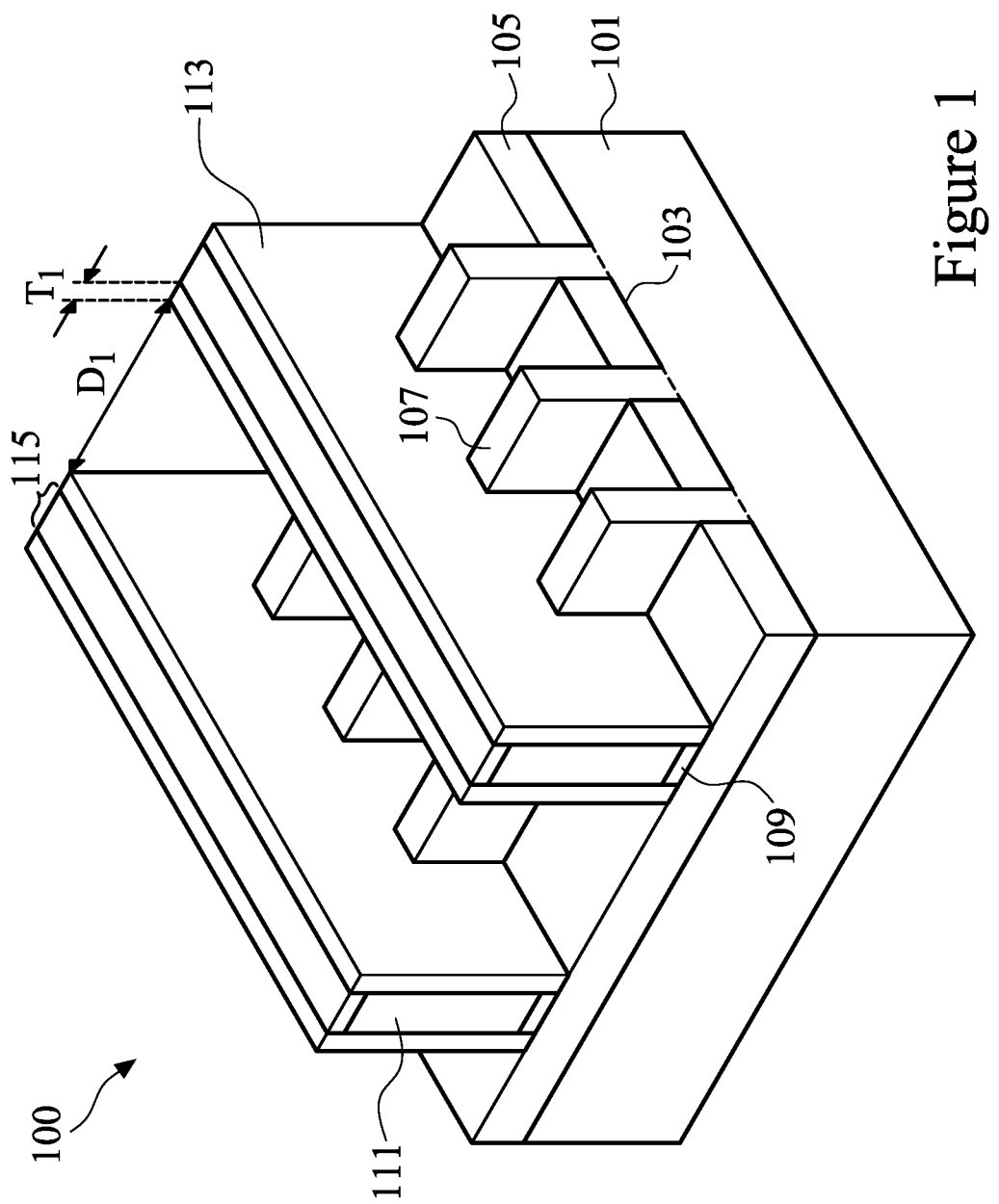
FIG. 1 illustrates steps in a process of forming a finFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated a perspective view of a semiconductor device 100 such as a finFET device. In an embodiment the semiconductor device 100 comprises a substrate 101 with first trenches 103 formed therein. The substrate 101 may be a silicon substrate, although other substrates, such as semiconductor-on-insulator (SOI), strained SOI, and silicon germanium on insulator, could be used. The substrate 101 may be a p-type semiconductor, although in other embodiments, it could be an n-type semiconductor.

The first trenches 103 may be formed as an initial step in the eventual formation of first isolation regions 105. The first trenches 103 may be formed using a masking layer (not separately illustrated in FIG. 1) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 101 that will be removed to form the first trenches 103.

As one of skill in the art will recognize, however, the processes and materials described above to form the masking layer are not the only method that may be used to protect portions of the substrate 101 while exposing other portions of the substrate 101 for the formation of the first trenches 103. Any suitable process, such as a patterned and developed photoresist, may be utilized to expose portions of the substrate 101 to be removed to form the first trenches 103. All such methods are fully intended to be included in the scope of the present embodiments.

Once a masking layer has been formed and patterned, the first trenches 103 are formed in the substrate 101. The exposed substrate 101 may be removed through a suitable process such as reactive ion etching (RIE) in order to form the first trenches 103 in the substrate 101, although any suitable process may be used. In an embodiment, the first trenches 103 may be formed to have a first depth of less than about 5,000 Å from the surface of the substrate 101, such as about 2,500 Å.

However, as one of ordinary skill in the art will recognize, the process described above to form the first trenches 103 is merely one potential process, and is not meant to be the only embodiment. Rather, any suitable process through which the first trenches 103 may be formed may be utilized and any suitable process, including any number of masking and removal steps may be used.

In addition to forming the first trenches 103, the masking and etching process additionally forms fins 107 from those portions of the substrate 101 that remain unremoved. For convenience the fins 107 have been illustrated in the figures as being separated from the substrate 101 by a dashed line, although a physical indication of the separation may or may not be present. These fins 107 may be used, as discussed below, to form the channel region of multiple-gate FinFET transistors. While FIG. 1 only illustrates three fins 107 formed from the substrate 101, any number of fins 107 may be utilized.

The fins 107 may be formed such that they have a width at the surface of the substrate 101 of between about 5 nm and about 80 nm, such as about 30 nm. Additionally, the fins 107 may be spaced apart from each other by a distance of between about 10 nm and about 100 nm, such as about 50 nm. By spacing the fins 107 in such a fashion, the fins 107 may each form a separate channel region while still being close enough to share a common gate (discussed further below).

Once the first trenches 103 and the fins 107 have been formed, the first trenches 103 may be filled with a dielectric material and the dielectric material may be recessed within the first trenches 103 to form the first isolation regions 105. The dielectric material may be an oxide material, a high-density plasma (HDP) oxide, or the like. The dielectric material may be formed, after an optional cleaning and lining of the first trenches 103, using either a chemical vapor deposition (CVD) method (e.g., the HARP process), a high density plasma CVD method, or other suitable method of formation as is known in the art.

The first trenches 103 may be filled by overfilling the first trenches 103 and the substrate 101 with the dielectric material and then removing the excess material outside of the first trenches 103 and the fins 107 through a suitable process such as chemical mechanical polishing (CMP), an etch, a combination of these, or the like. In an embodiment, the removal process removes any dielectric material that is located over the fins 107 as well, so that the removal of the dielectric material will expose the surface of the fins 107 to further processing steps.

Once the first trenches 103 have been filled with the dielectric material, the dielectric material may then be recessed away from the surface of the fins 107. The recessing may be performed to expose at least a portion of the sidewalls of the fins 107 adjacent to the top surface of the fins 107. The dielectric material may be recessed using a wet etch by dipping the top surface of the fins 107 into an etchant such as HF, although other etchants, such as $H_2$, and other methods, such as a reactive ion etch, a dry etch with etchants such as $NH_3/NF_3$, chemical oxide removal, or dry chemical clean may be used. The dielectric material may be recessed to a distance from the surface of the fins 107 of between about 50 Å and about 500 Å, such as about 400 Å. Additionally, the recessing may also remove any leftover dielectric material located over the fins 107 to ensure that the fins 107 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 103 with the dielectric material. All of the potential process steps are fully intended to be included within the scope of the present embodiment.

After the first isolation regions 105 have been formed, a dummy gate dielectric 109, a dummy gate electrode 111 over the dummy gate dielectric 109, and first spacers 113 may be formed over each of the fins 107. In an embodiment the dummy gate dielectric 109 may be formed by thermal oxidation, chemical vapor deposition, sputtering, or any other methods known and used in the art for forming a gate dielectric. Depending on the technique of gate dielectric formation, the dummy gate dielectric 109 thickness on the top of the fins 107 may be different from the gate dielectric thickness on the sidewall of the fins 107.

The dummy gate dielectric 109 may comprise a material such as silicon dioxide or silicon oxynitride with a thickness ranging from about 3 angstroms to about 100 angstroms, such as about 10 angstroms. The dummy gate dielectric 109 may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectric 109.

The dummy gate electrode 111 may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrode 111 may be deposited by chemical vapor deposition (CVD), sputter deposition, or other techniques known and used in the art for depositing conductive materials. The thickness of the dummy gate electrode 111 may be in the range of about 5 Å to about 200 Å. The top surface of the dummy gate electrode 111 may have a non-planar top surface, and may be planarized prior to patterning of the dummy gate electrode 111 or gate etch. Ions may or may not be introduced into the dummy gate electrode 111 at this point. Ions may be introduced, for example, by ion implantation techniques.

Once formed, the dummy gate dielectric 109 and the dummy gate electrode 111 may be patterned to form a series of stacks 115 over the fins 107. The stacks 115 define multiple channel regions located on each side of the fins 107 beneath the dummy gate dielectric 109. The stacks 115 may be formed by depositing and patterning a gate mask (not separately illustrated in FIG. 1) on the dummy gate electrode 111 using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrode 111 and the dummy gate dielectric 109 may be etched using a dry etching process to form the patterned stacks 115.

Once the stacks 115 have been patterned, the first spacers 113 may be formed. The first spacers 113 may be formed on opposing sides of the stacks 115. The first spacers 113 are typically formed by blanket depositing a spacer layer (not separately illustrated in FIG. 1) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 105. The first spacers 113 may then be patterned, such as by one or more etches to remove the spacer layer from the horizontal surfaces of the structure, to form the first spacers 113.

In an embodiment the first spacers 113 may be formed to have a first thickness $T_1$ of between about 5 Å and about 500 Å. Additionally, once the first spacers 113 have been formed, a first spacer 113 adjacent to one stack 115 may be separated from a first spacer 113 adjacent to another stack 115 by a first distance $D_1$ of between about 5 nm and about 200 nm, such as about 20 nm. However, any suitable thicknesses and distances may be utilized.

Figure 2A:
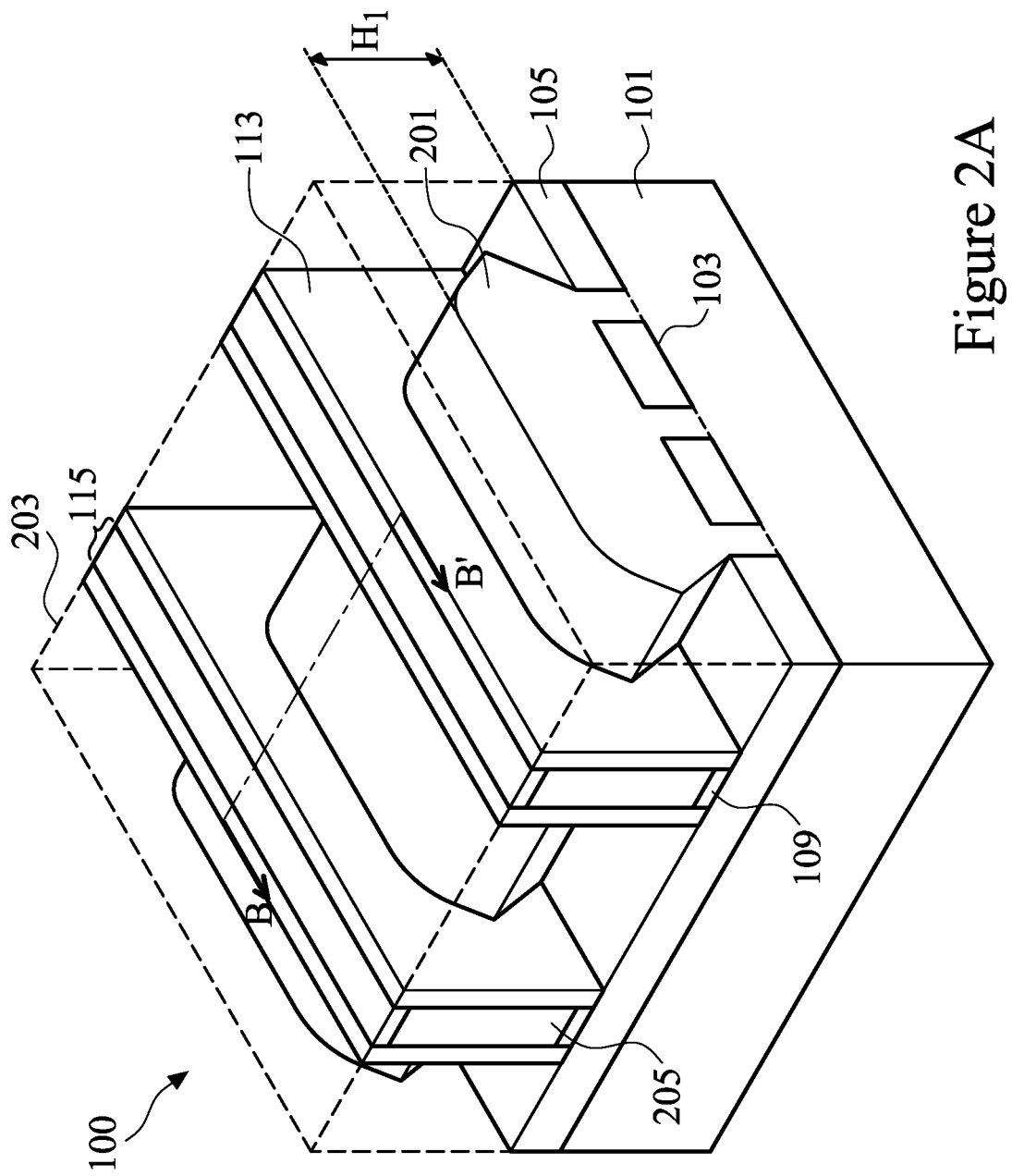
FIGS. 2A-2B illustrate formation of source/drain regions in accordance with some embodiments.
Figure 2B:
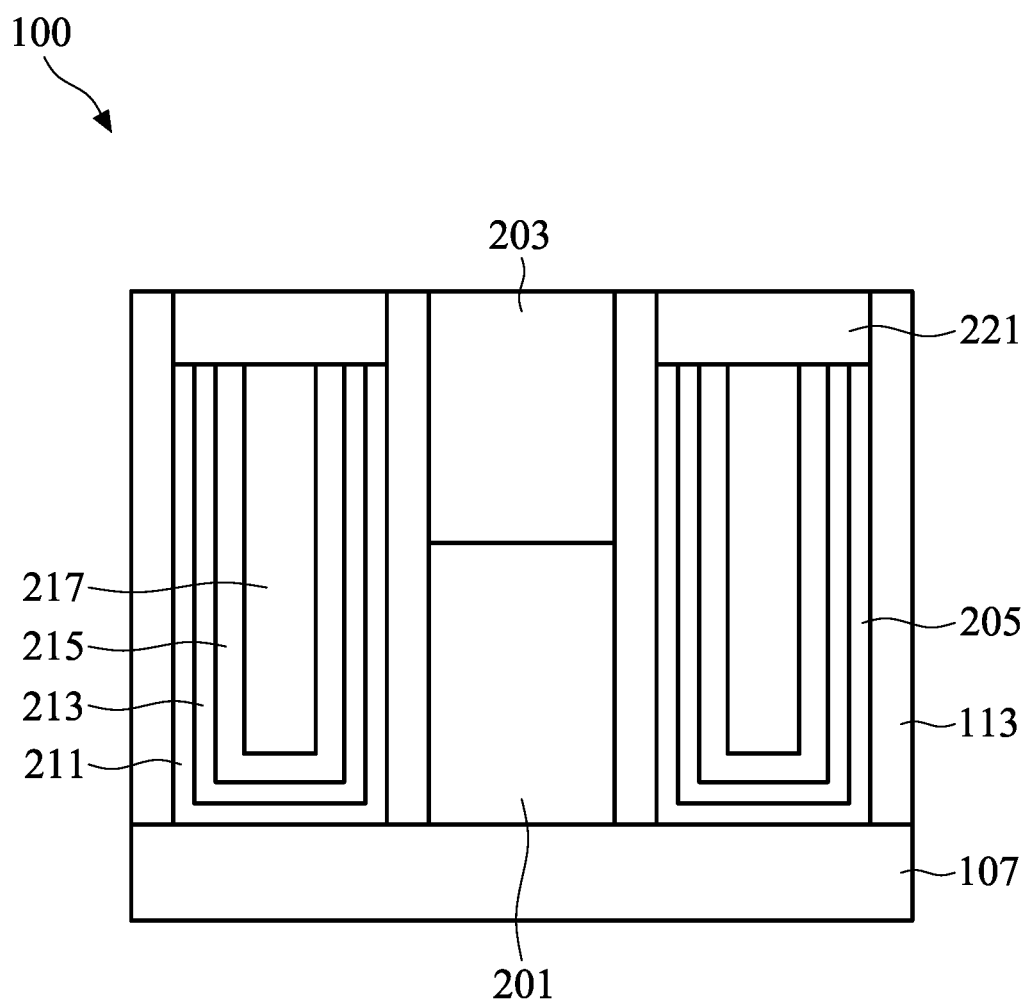

FIGS. 2A-2B illustrate a removal of the fins 107 from those areas not protected by the stacks 115 and the first spacers 113 and a regrowth of source/drain regions 201 (with FIG. 2B illustrating a cross-sectional view of FIG. 2A along line B-B'). The removal of the fins 107 from those areas not protected by the stacks 115 and the first spacers 113 may be performed by a reactive ion etch (RIE) using the stacks 115 and the first spacers 113 as hardmasks, or by any other suitable removal process. The removal may be continued until the fins 107 are either planar with (as illustrated) or below the surface of the first isolation regions 105.

Once these portions of the fins 107 have been removed, a hard mask (not separately illustrated), is placed and patterned to cover the dummy gate electrode 111 to prevent growth and the source/drain regions 201 may be regrown in contact with each of the fins 107. In an embodiment the source/drain regions 201 may be regrown and, in some embodiments the source/drain regions 201 may be regrown to form a stressor that will impart a stress to the channel regions of the fins 107 located underneath the stacks 115. In an embodiment wherein the fins 107 comprise silicon and the FinFET is a p-type device, the source/drain regions 201 may be regrown through a selective epitaxial process with a material, such as silicon or else a material such as silicon germanium that has a different lattice constant than the channel regions. The epitaxial growth process may use precursors such as silane, dichlorosilane, germane, and the like, and may continue for between about 5 minutes and about 120 minutes, such as about 30 minutes.

In an embodiment the source/drain regions 201 may be formed to have a thickness of between about 5 Å and about 1000 Å and a first height $H_1$ over the first isolation regions 105 of between about 10 Å and about 500 Å, such as about 200 Å. In this embodiment, the source/drain regions 201 may be formed to have a height above the upper surface of the first isolation regions 105 of between about 5 nm and about 250 nm, such as about 100 nm. However, any suitable height may be utilized.

Once the source/drain regions 201 are formed, dopants may be implanted into the source/drain regions 201 by implanting appropriate dopants to complement the dopants in the fins 107. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the stacks 115 and the first spacers 113 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate electrode 111 during the formation of the source/drain regions 201 is removed. In an embodiment the hard mask may be removed using, e.g., a wet or dry etching process that is selective to the material of the hard mask. However, any suitable removal process may be utilized.

FIG. 2A also illustrates a formation of an inter-layer dielectric (ILD) layer 203 (illustrated in dashed lines in FIG. 2A in order to more clearly illustrate the underlying structures) over the stacks 115 and the source/drain regions 201. The ILD layer 203 may comprise a material such as boron phosphorous silicate glass (BPSG), although any suitable dielectrics may be used. The ILD layer 203 may be formed using a process such as PECVD, although other processes, such as LPCVD, may alternatively be used. The ILD layer 203 may be formed to a thickness of between about 100 Å and about 3,000 Å. Once formed, the ILD layer 203 may be planarized with the first spacers 113 using, e.g., a planarization process such as chemical mechanical polishing process, although any suitable process may be utilized.

After the formation of the ILD layer 203, the material of the dummy gate electrode 111 and the dummy gate dielectric 109 may be removed and replaced to form the gate stack 205. In an embodiment the dummy gate electrode 111 may be removed using, e.g., a wet or dry etching process that utilizes etchants that are selective to the material of the dummy gate electrode 111. However, any suitable removal process may be utilized.

Once the dummy gate electrode 111 has been removed, the openings left behind may be refilled to form the gate stack 205. In a particular embodiment the gate stack 205 comprises a first dielectric material 211, a first metal material 213, a second metal material 215, and a third metal material 217. In an embodiment the first dielectric material 211 is a high-k material such as $HfO_2$, HfSiO, HfSiON, HfTaO, HfTiO, HfZrO, LaO, ZrO, $Ta_2O_5$, combinations of these, or the like, deposited through a process such as atomic layer deposition, chemical vapor deposition, or the like. The first dielectric material 211 may be deposited to a thickness of between about 5 Å and about 200 Å, although any suitable material and thickness may be utilized.

The first metal material 213 may be formed adjacent to the first dielectric material 211 and may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material 213 may be deposited using a deposition process such as atomic layer deposition, chemical vapor deposition, sputtering, or the like, to a thickness of between about 5 Å and about 200 Å, although any suitable deposition process or thickness may be used.

The second metal material 215 may be formed adjacent to the first metal material 213 and, in a particular embodiment, may be similar to the first metal material 213. For example, the second metal material 215 may be formed from a metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material 215 may be deposited using a deposition process such as atomic layer deposition, chemical vapor deposition, sputtering, or the like, to a thickness of between about 5 Å and about 200 Å, although any suitable deposition process or thickness may be used.

The third metal material 217 fills a remainder of the opening left behind by the removal of the dummy gate electrode 111. In an embodiment the third metal material 217 is a metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the opening left behind by the removal of the dummy gate electrode 111. In a particular embodiment the third metal material 217 may be deposited to a thickness of between about 5 Å and about 500 Å, although any suitable material, deposition process, and thickness may be utilized.

Once the opening left behind by the removal of the dummy gate electrode 111 has been filled, the materials may be planarized in order to remove any material that is outside of the opening left behind by the removal of the dummy gate electrode 111. In a particular embodiment the removal may be performed using a planarization process such as chemical mechanical polishing. However, any suitable planarization and removal process may be utilized.

After the materials of the gate stack 205 have been formed and planarized, the materials of the gate stack 205 may be recessed and capped with a capping layer 221. In an embodiment the materials of the gate stack 205 may be recessed using, e.g., a wet or dry etching process that utilizes etchants selective to the materials of the gate stack 205. In an embodiment the materials of the gate stack 205 may be recessed a distance of between about 5 nm and about 150 nm, such as about 120 nm. However, any suitable process and distance may be utilized.

Once the materials of the gate stack 205 have been recessed, the capping layer 221 may be deposited and planarized with the first spacers 113. In an embodiment the capping layer 221 is a material such as SiN, SiON, SiCON, SiC, SiOC, combinations of these, or the like, deposited using a deposition process such as atomic layer deposition, chemical vapor deposition, sputtering, or the like. The capping layer 221 may be deposited to a thickness of between about 5 Å and about 200 Å, and then planarized using a planarization process such as chemical mechanical polishing such that the capping layer 221 is planar with the first spacers 113.

Figure 3:
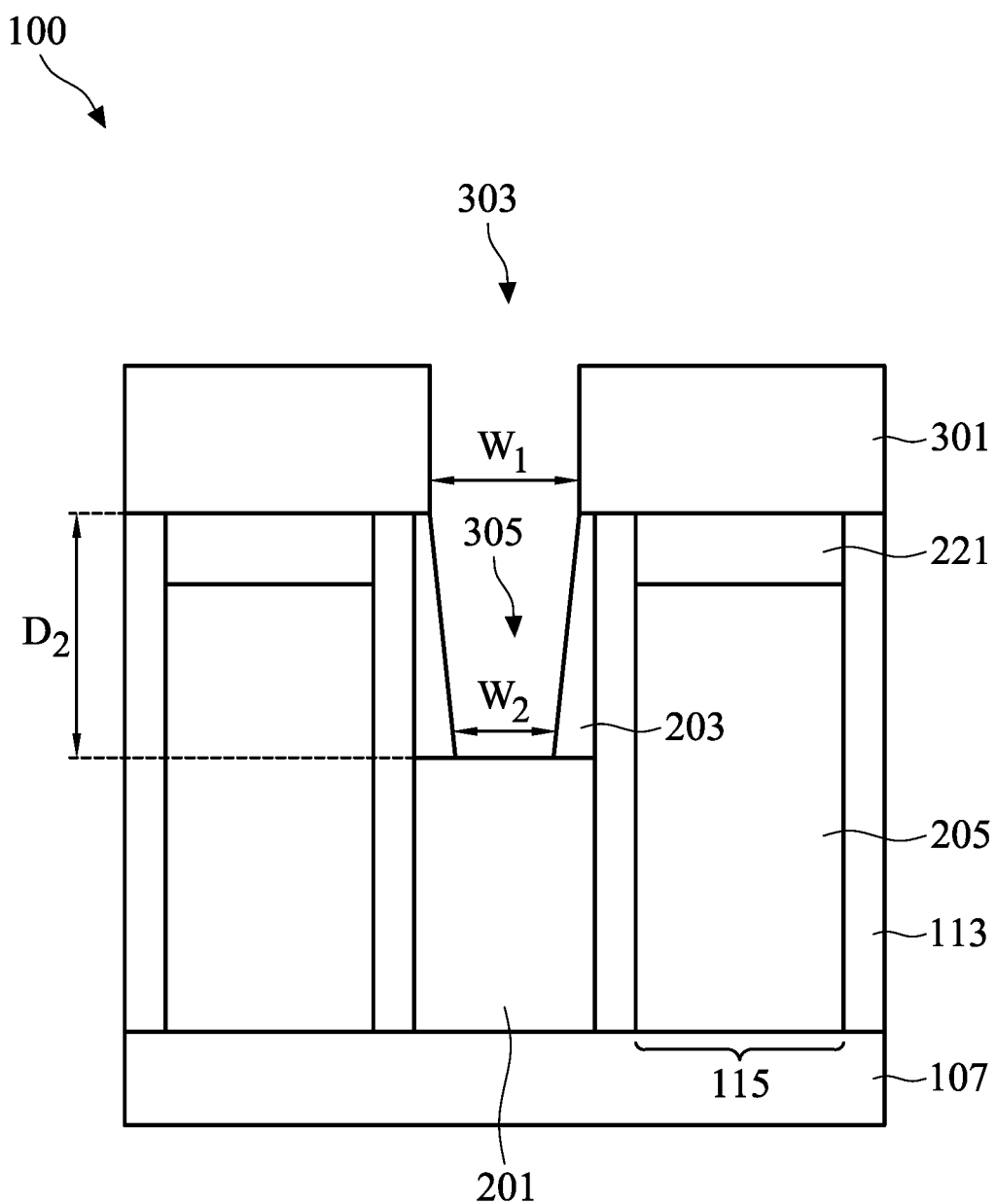
FIG. 3 illustrates a formation of a first opening in accordance with some embodiments.

FIG. 3 illustrates a formation of a first opening 305 through the first etch stop layer 223 and through the ILD layer 203 in order to expose the source/drain regions 201 in preparation for formation of a first contact 401 (not illustrated in FIG. 3 but illustrated and described below with respect to FIG. 4). Additionally, for convenience, the gate stack 205 is illustrated in a simplified form without showing the additional layers. In an embodiment the first opening 305 may be formed by initially placing and patterning a first photoresist 301 over the source/drain regions 201. In an embodiment the first photoresist 301 is a tri-layer photoresist, with a bottom anti-reflective coating (BARC) layer, an intermediate mask layer, and a top photoresist layer (not separately illustrated within FIG. 3). However, any suitable type of photosensitive material or combination of materials may be utilized.

Once the first photoresist 301 has been placed, the first photoresist 301 is patterned. In an embodiment the first photoresist 301 may be patterned by exposing a photosensitive material within the first photoresist 301 (e.g., the top photoresist layer in the tri-layer photoresist) to a patterned energy source (e.g., light) through, e.g., a reticle. The impact of the energy will cause a chemical reaction in those parts of the photosensitive material that were impacted by the patterned energy source, thereby modifying the physical properties of the exposed portions of the photoresist such that the physical properties of the exposed portions of the first photoresist 301 are different from the physical properties of the unexposed portions of the first photoresist 301. The first photoresist 301 may then be developed with, e.g., a developer (not separately illustrated), in order to separate the exposed portion of the first photoresist 301 from the unexposed portion of the first photoresist 301.

In an embodiment the first photoresist 301 is patterned to form an opening that exposes the first etch stop layer 223. As such, the first photoresist 301 is patterned to form an opening with a first width $W_1$ of between about 50 Å and about 1000 Å, such as about 200 Å. However, any suitable width may be utilized.

Once the first photoresist 301 has been patterned, the first opening 305 may be formed using the first photoresist 301 as a mask. In an embodiment the first opening 305 may be formed using a first etching process (represented in FIG. 3 by the wavy line labeled 303), which may be an anisotropic etching process such as a reactive ion etch process. In a particular embodiment in which the source/drain regions 201 comprise a material such as silicon, the first etching process 303 may be a reactive ion etch using an etchant such as $H_2$, $BCl_3$, $SF_6$, $C_4F_8$, $CH_4$, $CH_3F$, $CH_2F_2$, $N_2$, $O_2$, Ar, $Cl_2$, NF3, HBr, $SiCl_4$, combinations of these, or the like. However, any suitable process, such as a wet etching process, and any suitable reactants may be used.

The first etching process 303 may be utilized to form the first opening 305 in preparation for a formation of the first contact 401. In a particular embodiment the first etching process 303 may be utilized to remove the material of the ILD layer 203 to a second distance $D_2$ of between about 5 nm and about 200 nm, such as about 15 nm. However, any suitable depth may be utilized. Additionally, the first opening 305 at a point adjacent to a top of the first spacer 113 may have the first width $W_1$ (from the first photoresist 301) and may also have a second width $W_2$ at a bottom of the first opening 305 of between about 8 nm and about 40 nm. However, any suitable dimensions may be utilized.

Once the first opening 305 has been formed, the first photoresist 301 may be removed. In an embodiment the first photoresist 301 may be removed using, e.g., an ashing process, whereby a temperature of the first photoresist 301 is increased until the first photoresist 301 undergoes a thermal decomposition, at which point the first photoresist 301 may be easily removed. However, any suitable removal process, such as a wet etch, may also be utilized.

Figure 4:
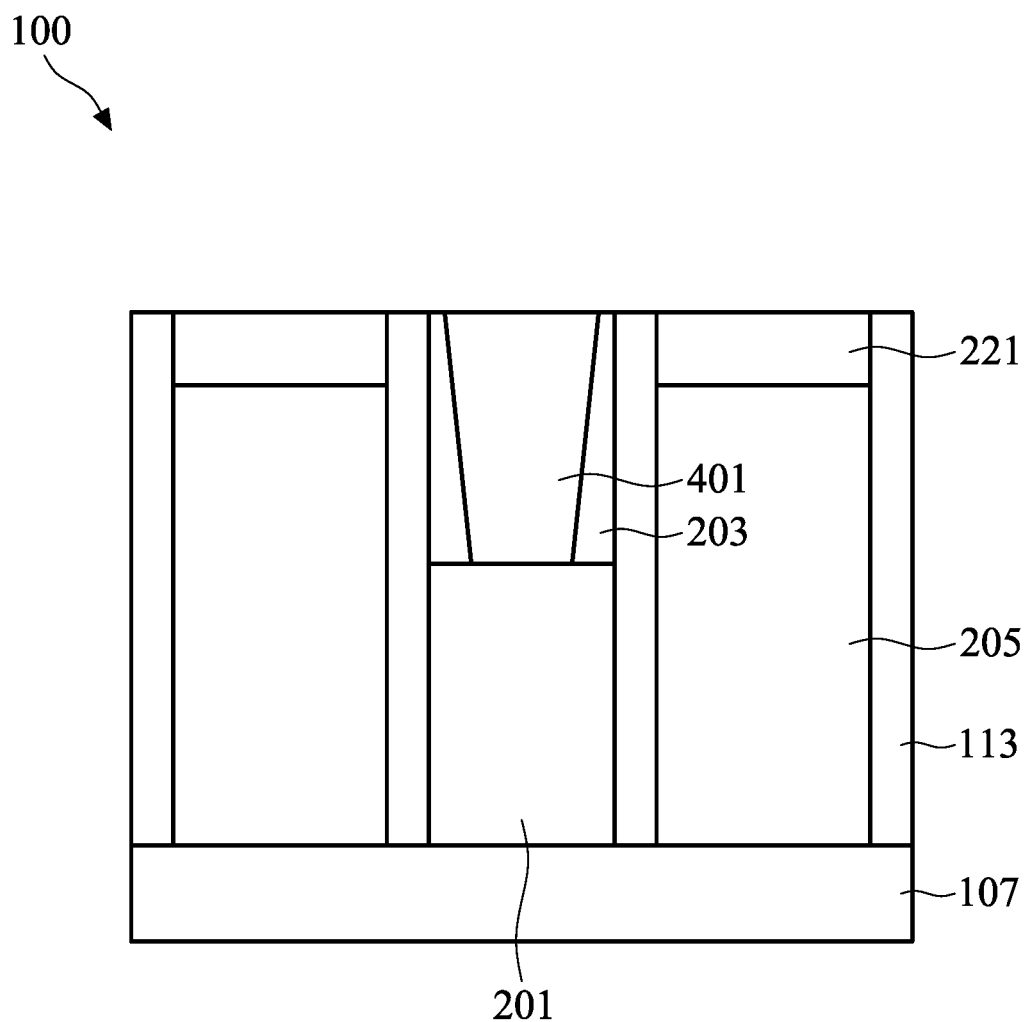
FIG. 4 illustrates a formation of a first contact in accordance with some embodiments.

FIG. 4 illustrates a formation of an optional silicide contact (not illustrated) as well as a filling of the first opening 305 formed by the first etching process 303 to form the first contact 401. The silicide contact may comprise titanium, nickel, cobalt, or erbium in order to reduce the Schottky barrier height of the contact. However, other metals, such as platinum, palladium, and the like, may also be used. The silicidation may be performed by blanket deposition of an appropriate metal layer, followed by an annealing step which causes the metal to react with the underlying exposed silicon. Un-reacted metal is then removed, such as with a selective etch process. The thickness of the silicide contact may be between about 5 nm and about 50 nm.

In an embodiment the first contact 401 may be a conductive material such as W, Al, Cu, AlCu, W, TaC, TaCN, TaSiN, Mn, Zr, TiN, Ta, TaN, Co, Ni, Ti, TiAlN, Ru, Mo, or WN, although any suitable material, such as aluminum, copper, alloys of these, combinations of these, or the like, and may be deposited into the first opening 305 using a deposition process such as sputtering, chemical vapor deposition, electroplating, electroless plating, or the like, to fill and/or overfill the first opening 305 formed by the first etching process 303. Once filled or overfilled, any deposited material outside of the first opening 305 formed by the first etching process 303 may be removed using a planarization process such as chemical mechanical polishing (CMP), and the first contact 401 may have a thickness of between about 5 Å and about 2000 Å. However, any suitable material and process of formation may be utilized.

Figure 5:
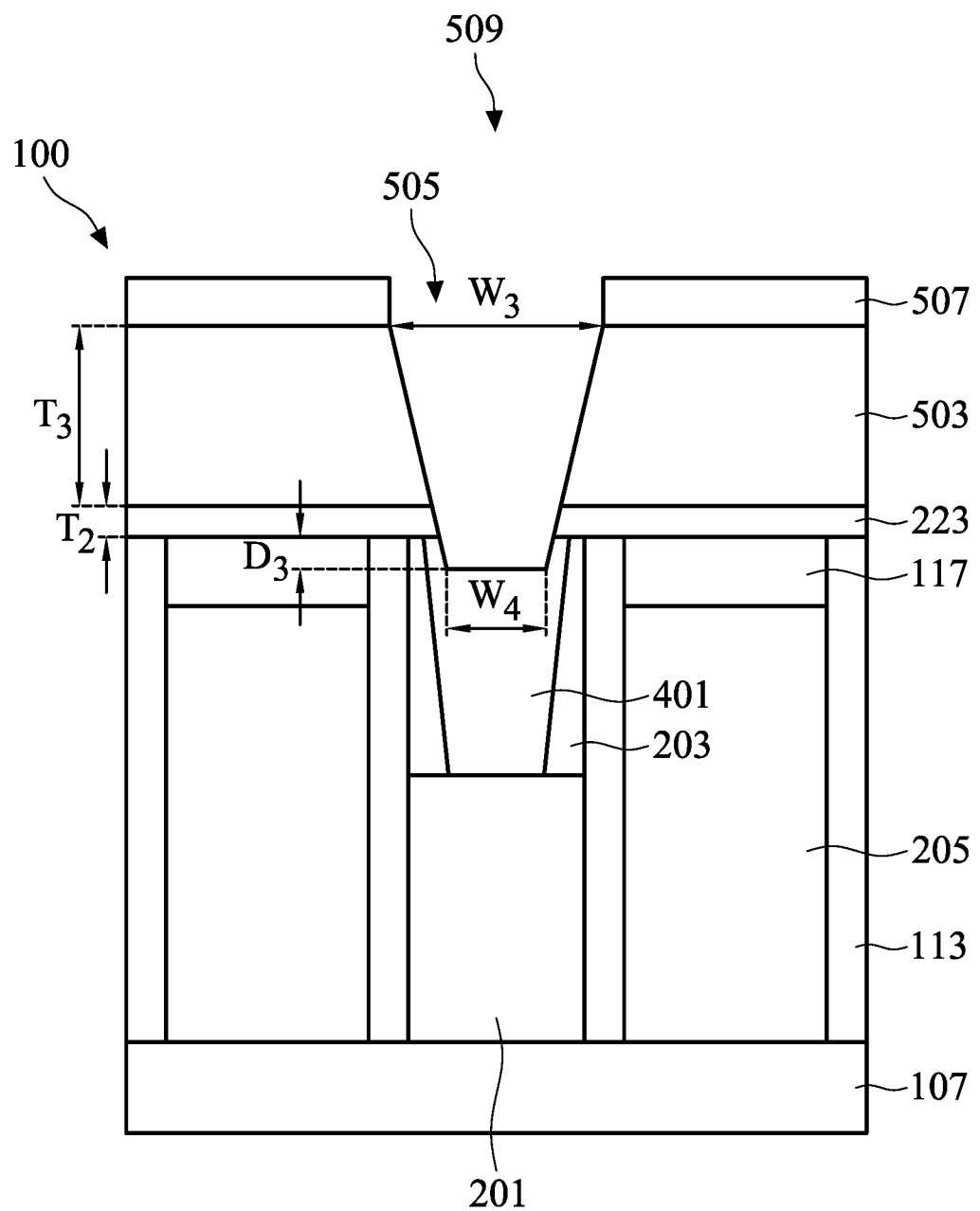
FIG. 5 illustrates a formation of a second opening in a first dielectric layer in accordance with some embodiments.

FIG. 5 illustrate a formation of a first etch stop layer 223 over the gate stacks 205. In one embodiment, the first etch stop layer 223 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 223, such as low pressure CVD (LPCVD), PVD, or the like, could alternatively be used. The first etch stop layer 223 may have a second thickness $T_2$ of between about 5 Å and about 500 Å.

FIG. 5 also illustrates a formation of a first dielectric layer 503 over the gate electrodes 111. The first dielectric layer 503 may be made of one or more suitable dielectric materials such as low-k dielectrics such as carbon doped oxides, extremely low-k dielectrics such as porous carbon doped silicon dioxide, silicon oxide, silicon nitride, a polymer such as polyimide, combinations of these, or the like. The first dielectric layer 503 may be formed through a process such as a spin-on process or a chemical vapor deposition (CVD), although any suitable process may be utilized, and may have a third thickness $T_3$ of between about 5 Å and about 500 Å, such as about 50 Å.

FIG. 5 also illustrates a patterning of both the first dielectric layer 503 and the first etch stop layer 223 to form a second opening 505 that exposes the first contact 401. In an embodiment the first dielectric layer 503 and the first etch stop layer 223 may be patterned by initially placing and patterning a second photoresist 507 over the first dielectric layer 503. In an embodiment the second photoresist 507 is similar to the first photoresist 301 (described above with respect to FIG. 3) and may be placed and patterned in a similar fashion. For example, the second photoresist 507 may be a tri-layer photoresist that is exposed with a patterned energy in order to pattern the second photoresist 507. The second photoresist 507 may then be developed and etched to pattern the second photoresist 507.

Once the second photoresist 507 has been patterned, the pattern of the second photoresist 507 may be transferred to the first dielectric layer 503 and the first etch stop layer 223 using the second photoresist 507 as a mask. In an embodiment the first dielectric layer 503 may be patterned using a second etching process (represented in FIG. 5 by the wavy line labeled 509), which may be an anisotropic etching process such as a reactive ion etch process. However, any suitable process, such as a wet etching process, and any suitable reactants may be used.

The second etching process 509 may be utilized to remove the material of the first dielectric layer 503 to form the second opening 505 in preparation of a formation of a second contact 701 (not illustrated in FIG. 5 but illustrated and discussed below with respect to FIG. 7). In a particular embodiment the second etching process 509 may be utilized to remove the material of the first dielectric layer 503 until the first etch stop layer 223 is exposed. However, any suitable process of removal, such as a wet etch, may be utilized.

Once the first etch stop layer 223 has been exposed, the pattern of the first dielectric layer 503 may be transferred through the first etch stop layer 223 to expose the first contact 401. In an embodiment the pattern may be transferred using, e.g., an anisotropic etch process, such as a reactive ion etch, that uses etchants selective to the material of the first etch stop layer 223. However, any suitable etchants or processes, such as a wet etch, may also be utilized.

Additionally, after the first etch stop layer 223 has been opened to expose the underlying first contact 401, the etching may either be stopped without extending into the first contact 401 or else may be continued to slightly overetch and form the second opening 505 to extend partially into the first contact 401. In a particular embodiment the second opening 505 may extend into the first contact 401 a third distance $D_3$ of between about 5 Å and about 100 Å, such as about 20 Å. However, any suitable distance may be utilized.

In an embodiment the second opening 505 may be formed to have tapered sidewalls such that the top of the second opening 505 is larger than the bottom of the second opening 505. In a particular embodiment the second opening 505 may have a third width $W_3$ at a top of the second opening 505 (adjacent to the first dielectric layer 503) of between about 100 Å and about 1500 Å, such as about 200 Å. Additionally, in a particular embodiment the second contact may have a fourth width $W_4$ at a bottom of the second opening 505 (adjacent to the first contact 401) that may be equal to or less than the third width $W_3$, such as having the fourth width $W_4$ of between about 10 nm and about 50 nm. However, any suitable dimensions may be utilized.

Figure 6A:
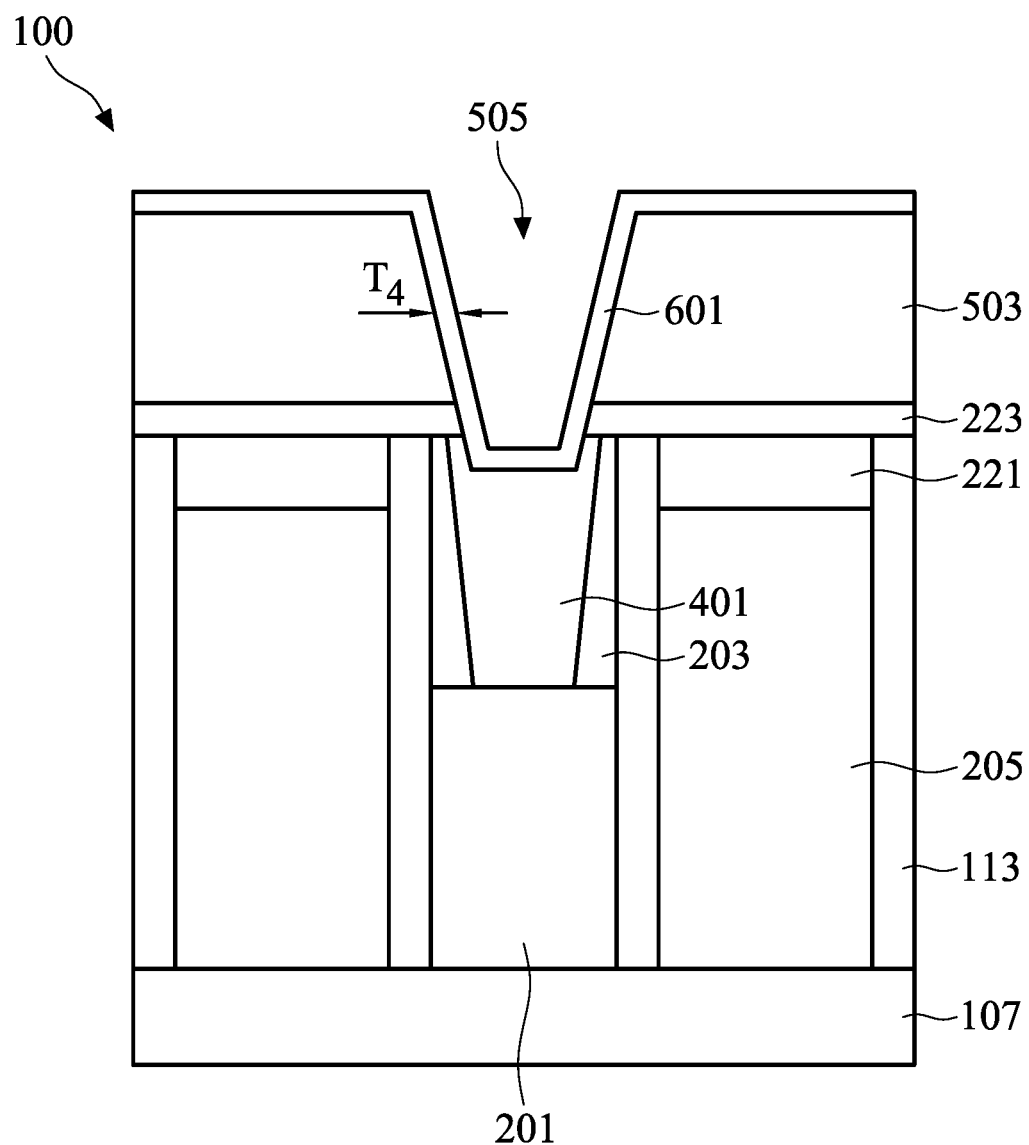
FIGS. 6A-6C illustrate a deposition of a second dielectric layer in accordance with some embodiments.

FIG. 6A illustrates that, once the second opening 505 has been formed, a second dielectric layer 601 may be formed to line the second opening 505. In an embodiment the second dielectric layer 601 may comprise a dielectric material such as silicon nitride, SiON, SiCON, SiC, SiCN, SiOC, combinations of these or the like and may be deposited to a thickness of between about 5 Å and about 200 Å, with a critical dimension of between about 5 Å and about 50 Å. Additionally, the second dielectric layer 601 may have a critical dimension of greater than about 0.5 nm. However, any suitable material and thickness may be utilized.

Figure 6B:
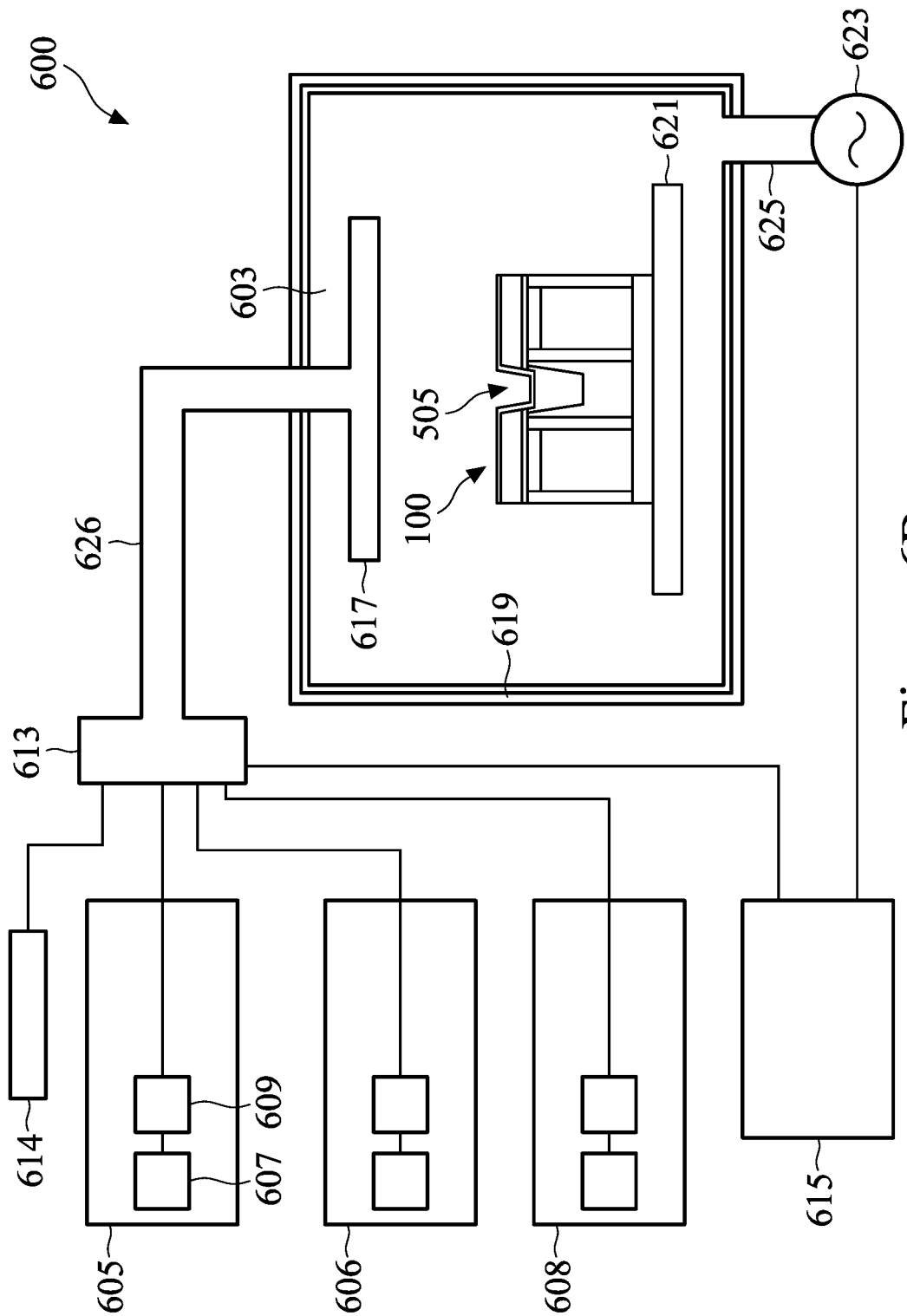

FIG. 6B illustrates a deposition system 600 that may be used to form the second dielectric layer 601 using a conformal deposition process such as atomic layer deposition. In an embodiment the deposition system 600 receives precursor materials from a first precursor delivery system 605 and a second precursor delivery system 606 to form a series of monolayers of materials to line the second opening 505. In an embodiment the first precursor delivery system 605 and the second precursor delivery system 606 may work in conjunction with one another to supply the various different precursor materials to a deposition chamber 603 wherein the substrate 101 (and consequently the second opening 505) are placed. However, the first precursor delivery system 605 and the second precursor delivery system 606 may have physical components that are similar with each other.

For example, the first precursor delivery system 605 and the second precursor delivery system 606 may each include a gas supply 607 and a flow controller 609 (labeled in FIG. 6B with regards to the first precursor delivery system 605 but not labeled for clarity with respect to the second precursor delivery system 606). In an embodiment in which the first treatment precursor is stored in a gaseous state, the gas supply 607 may supply the first treatment precursor to the deposition chamber 603. The gas supply 607 may be a vessel, such as a gas storage tank, that is located either locally to the deposition chamber 603 or else may be located remotely from the deposition chamber 603. Alternatively, the gas supply 607 may be a facility that independently prepares and delivers the first treatment precursor to the flow controller 609. Any suitable source for the first treatment precursor may be utilized as the gas supply 607, and all such sources are fully intended to be included within the scope of the embodiments.

The gas supply 607 may supply the desired precursor to the flow controller 609. The flow controller 609 may be utilized to control the flow of the precursor to the precursor gas controller 613 and, eventually, to the deposition chamber 603, thereby also helping to control the pressure within the deposition chamber 603. The flow controller 609 may be, e.g., a proportional valve, a modulating valve, a needle valve, a pressure regulator, a mass flow controller, combinations of these, or the like. However, any suitable method for controlling and regulating the flow may be utilized, and all such components and methods are fully intended to be included within the scope of the embodiments.

However, as one of ordinary skill in the art will recognize, while the first precursor delivery system 605 and the second precursor delivery system 606 have been described herein as having identical components, this is merely an illustrative example and is not intended to limit the embodiments in any fashion. Any type of suitable precursor delivery system, with any type and number of individual components identical to or different from any of the other precursor delivery systems within the deposition system 600, may alternatively be utilized. All such precursor systems are fully intended to be included within the scope of the embodiments.

Additionally, in an embodiment in which the first treatment precursor is stored in a solid or liquid state, the gas supply 607 may store a carrier gas and the carrier gas may be introduced into a precursor canister (not separately illustrated), which stores the first treatment precursor in the solid or liquid state. The carrier gas is then used to push and carry the first treatment precursor as it either evaporates or sublimates into a gaseous section of the precursor canister before being sent to a precursor gas controller 613. Any suitable method and combination of units may be utilized to provide the first treatment precursor, and all such combination of units are fully intended to be included within the scope of the embodiments.

The first precursor delivery system 605 and the second precursor delivery system 606 may supply their individual precursor materials into the precursor gas controller 613. The precursor gas controller 613 connects and isolates the first precursor delivery system 605 and the second precursor delivery system 606 to and from the deposition chamber 603 in order to deliver the desired precursor materials to the deposition chamber 603. The precursor gas controller 613 may include such devices as valves, flow meters, sensors, and the like to control the delivery rates of each of the precursors, and may be controlled by instructions received from the control unit 615 (described further below with respect to FIG. 6C).

The precursor gas controller 613, upon receiving instructions from the control unit 615, may open and close valves so as to connect one of the first precursor delivery system 605 and the second precursor delivery system 606 to the deposition chamber 603 and direct a desired precursor material through a manifold 626, into the deposition chamber 603, and to a showerhead 617. The showerhead 617 may be utilized to disperse the chosen precursor material into the deposition chamber 603 and may be designed to evenly disperse the precursor material in order to minimize undesired process conditions that may arise from uneven dispersal. In an embodiment the showerhead 617 may have a circular design with openings dispersed evenly around the showerhead 617 to allow for the dispersal of the desired precursor material into the deposition chamber 603.

However, as one of ordinary skill in the art will recognize, the introduction of precursor materials to the deposition chamber 603 through a single showerhead 617 or through a single point of introduction as described above is intended to be illustrative only and is not intended to be limiting to the embodiments. Any number of separate and independent showerheads 617 or other openings to introduce precursor materials into the deposition chamber 603 may alternatively be utilized. All such combinations of showerheads and other points of introduction are fully intended to be included within the scope of the embodiments.

The deposition chamber 603 may receive the desired precursor materials and expose the precursor materials to the sidewalls of the second opening 505, and the deposition chamber 603 may be any desired shape that may be suitable for dispersing the precursor materials and contacting the precursor materials with the sidewalls of the second opening 505. In the embodiment illustrated in FIG. 6B, the deposition chamber 603 has a cylindrical sidewall and a bottom. However, the deposition chamber 603 is not limited to a cylindrical shape, and any other suitable shape, such as a hollow square tube, an octagonal shape, or the like, may be utilized. Furthermore, the deposition chamber 603 may be surrounded by a housing 619 made of material that is inert to the various process materials. As such, while the housing 619 may be any suitable material that can withstand the chemistries and pressures involved in the deposition process, in an embodiment the housing 619 may be steel, stainless steel, nickel, aluminum, alloys of these, combinations of these, and like.

Within the deposition chamber 603 the substrate 101 may be placed on a mounting platform 621 in order to position and control the substrate 101 during the deposition processes. The mounting platform 621 may include heating mechanisms in order to heat the substrate 101 during the deposition processes. Furthermore, while a single mounting platform 621 is illustrated in FIG. 6B, any number of mounting platforms 621 may additionally be included within the deposition chamber 603.

Additionally, the deposition chamber 603 and the mounting platform 621 may be part of a cluster tool system (not shown). The cluster tool system may be used in conjunction with an automated handling system in order to position and place the substrate 101 into the deposition chamber 603 prior to the deposition processes, position, hold the substrate 101 during the deposition processes, and remove the substrate 101 from the deposition chamber 603 after the deposition processes.

The deposition chamber 603 may also have an exhaust outlet 625 for exhaust gases to exit the deposition chamber 603. A vacuum pump 623 may be connected to the exhaust outlet 625 of the deposition chamber 603 in order to help evacuate the exhaust gases. The vacuum pump 623, under control of the control unit 615, may also be utilized to reduce and control the pressure within the deposition chamber 603 to a desired pressure and may also be utilized to evacuate precursor materials from the deposition chamber 603 in preparation for the introduction of the next precursor material.

Figure 6C:
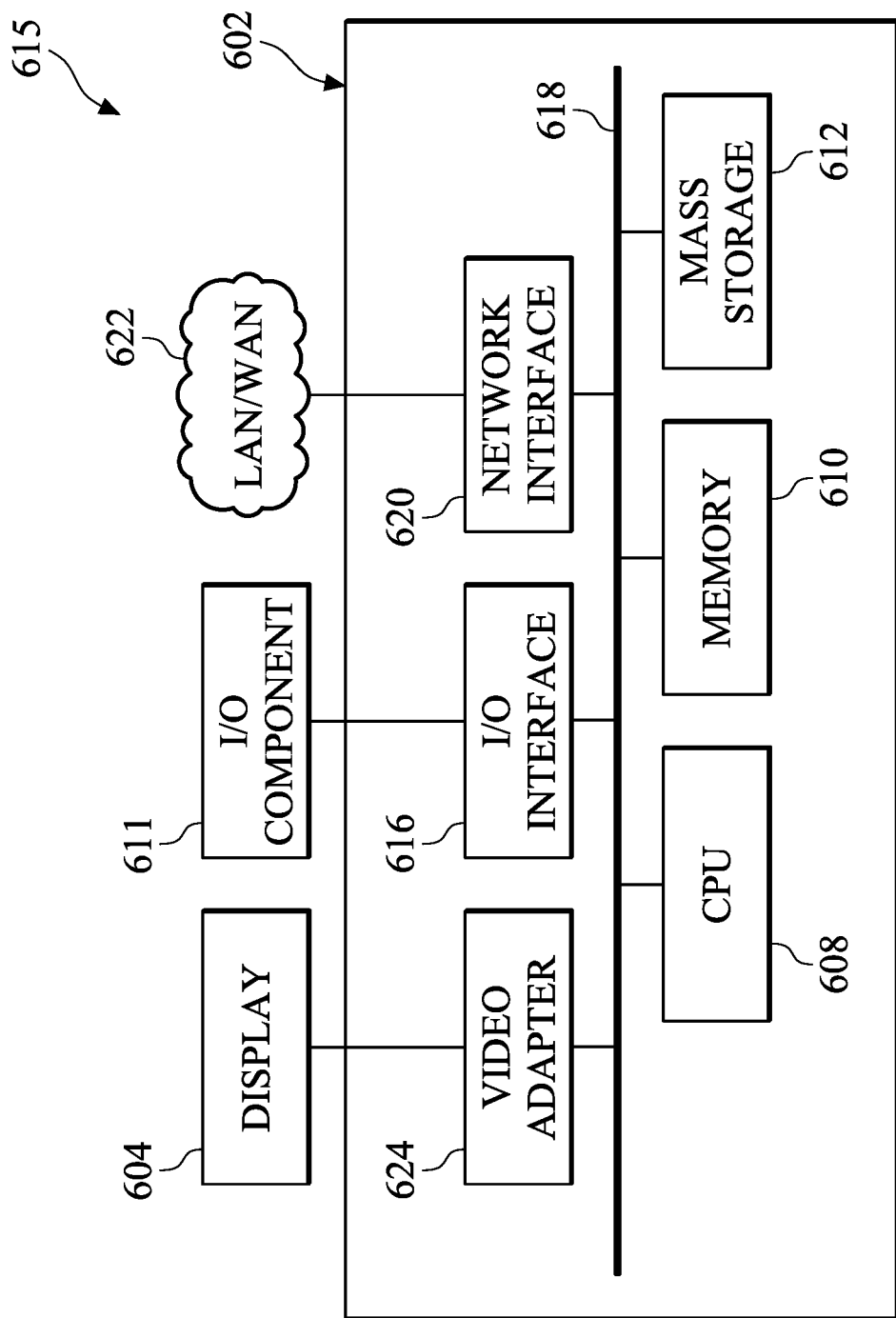

FIG. 6C illustrates an embodiment of the control unit 615 that may be utilized to control the precursor gas controller 613 and the vacuum pump 623 (as illustrated in FIG. 6B). The control unit 615 may be any form of computer processor that can be used in an industrial setting for controlling process machines. In an embodiment the control unit 615 may comprise a processing unit 602, such as a desktop computer, a workstation, a laptop computer, or a dedicated unit customized for a particular application. The control unit 615 may be equipped with a display 604 and one or more input/output components 611, such as instruction outputs, sensor inputs, a mouse, a keyboard, printer, combinations of these, or the like. The processing unit 602 may include a central processing unit (CPU) 608, memory 610, a mass storage device 612, a video adapter 624, and an I/O interface 616 connected to a bus 618.

The bus 618 may be one or more of any type of several bus architectures including a memory bus or memory controller, a peripheral bus, or video bus. The CPU 608 may comprise any type of electronic data processor, and the memory 610 may comprise any type of system memory, such as static random access memory (SRAM), dynamic random access memory (DRAM), or read-only memory (ROM). The mass storage device 612 may comprise any type of storage device configured to store data, programs, and other information and to make the data, programs, and other information accessible via the bus 618. The mass storage device 612 may comprise, for example, one or more of a hard disk drive, a magnetic disk drive, or an optical disk drive.

The video adapter 624 and the I/O interface 616 provide interfaces to couple external input and output devices to the processing unit 602. As illustrated in FIG. 6C, examples of input and output devices include the display 604 coupled to the video adapter 624 and the I/O component 611, such as a mouse, keyboard, printer, and the like, coupled to the I/O interface 616. Other devices may be coupled to the processing unit 602, and additional or fewer interface cards may be utilized. For example, a serial interface card (not shown) may be used to provide a serial interface for a printer. The processing unit 602 also may include a network interface 620 that may be a wired link to a local area network (LAN) or a wide area network (WAN) 622 and/or a wireless link.

It should be noted that the control unit 615 may include other components. For example, the control unit 615 may include power supplies, cables, a motherboard, removable storage media, cases, and the like. These other components, although not shown in FIG. 6C, are considered part of the control unit 615.

In an embodiment the formation of the second dielectric layer 601 may be initiated by putting a first precursor material into the first precursor delivery system 605. For example, in an embodiment in which the second dielectric layer 601 is silicon nitride, the first precursor material may be a precursor such as dichlorosilane and may be placed into the first precursor delivery system 605. However, as one of ordinary skill in the art will recognize, this precursor is not the only precursor that may be utilized to form a layer of silicon nitride, and the use of dichlorosilane is not intended to be limiting to the embodiments. Any suitable precursor material in any suitable phase (solid, liquid, or gas) to form a layer of silicon nitride, such as monochlorosilane, or any other precursor that may be used to form other materials, may be utilized.

Additionally, a second precursor material may be placed into the second precursor delivery system 606. In the embodiment in which a layer of silicon nitride is the desired material for the second dielectric layer 601, the second precursor material may be a precursor material that may contain nitrogen in order to react with the first precursor material to form a monolayer of silicon nitride. For example, in the embodiment in which dichlorosilane is utilized as the first precursor material, ammonia ($NH_3$) may be used as the second precursor material and may be placed into the second precursor delivery system 606. However, the description of ammonia as the second precursor material is not intended to be limiting to the embodiments, and any other suitable precursor material, such as $N_2$, combinations of these, or the like, may be utilized as the second precursor material.

Once the first precursor material and the second precursor material have been placed into the first precursor delivery system 605 and the second precursor delivery system 606, respectively, the formation of the second dielectric layer 601 may be initiated by the control unit 615 sending an instruction to the precursor gas controller 613 to connect the first precursor delivery system 605 to the deposition chamber 603. Once connected, the first precursor delivery system 605 can deliver the first precursor material (e.g., the dichlorosilane) to the showerhead 617 through the precursor gas controller 613 and the manifold 626. The showerhead 617 can then disperse the first precursor material into the deposition chamber 603, wherein the first precursor material can be adsorbed and react to the exposed surfaces around the second opening 505.

In the embodiment to form a layer of silicon nitride, the first precursor material may be flowed into the deposition chamber 603 at a flow rate of between about 1 slm and about 5 slm for about 50 second per cycle. Additionally, the deposition chamber 603 may be held at a pressure of between about 3 torr and about 5 torr, such as about 4 torr, and a temperature of between about 450° C. and about 700° C., such as about 550° C. However, as one of ordinary skill in the art will recognize, these process conditions are only intended to be illustrative, as any suitable process conditions may be utilized while remaining within the scope of the embodiments.

As the first precursor material is adsorbed onto the surfaces of the second opening 505, the first precursor material will react with open active sites located on the exposed surfaces. However, once all of the open active sites on the exposed surfaces have reacted with the first precursor material, the reaction will stop, as there are no more open active sites to which the first precursor material will bond.

This limitation causes the reaction of the first precursor material with the exposed surfaces of the second opening 505 to be self-limiting and to form a monolayer of the reacted first precursor material on the surfaces of the second opening 505, thereby allowing for a more precise control of the thickness of the second dielectric layer 601.

After the self-limiting reaction has finished, the deposition chamber 603 may be purged of the first precursor material. For example, the control unit 615 may instruct the precursor gas controller 613 to disconnect the first precursor delivery system 605 (containing the first precursor material to be purged from the deposition chamber 603) and to connect a purge gas delivery system 614 to deliver a purge gas to the deposition chamber 603. In an embodiment the purge gas delivery system 614 may be a gaseous tank or other facility that provides a purge gas such as nitrogen, argon, xenon, or other non-reactive gas to the deposition chamber 603. Additionally, the control unit 615 may also initiate the vacuum pump 623 in order to apply a pressure differential to the deposition chamber 603 to aid in the removal of the first precursor material. The purge gas, along with the vacuum pump 623, may purge the first precursor material from the deposition chamber 603 for about 3 seconds.

After the purge of the first precursor material has been completed, the introduction of the second precursor material (e.g., ammonia) to the deposition chamber 603 may be initiated by the control unit 615 sending an instruction to the precursor gas controller 613 to disconnect the purge gas delivery system 614 and to connect the second precursor delivery system 606 (containing the second precursor material) to the deposition chamber 603. Once connected, the second precursor delivery system 606 can deliver the second precursor material to the showerhead 617. The showerhead 617 can then disperse the second precursor material into the deposition chamber 603, wherein the second precursor material can be adsorbed on the exposed surfaces of the second opening 505 and react with the first precursor material in another self-limiting reaction to form a monolayer of the desired material, e.g., silicon nitride, on the exposed surfaces of the second opening 505.

In the embodiment discussed above to form a layer of silicon nitride with dichlorosilane, the ammonia may be introduced into the deposition chamber 603 at a flow rate of between about 2 slm and about 10 slm, such as about 5 slm, for about 30 seconds. Additionally, the deposition chamber 603 may be held at a pressure of about 0 torr and a temperature of between about 450° C. and about 700° C. However, as one of ordinary skill in the art will recognize, these process conditions are only intended to be illustrative, as any suitable process conditions may be utilized to introduce oxygen while remaining within the scope of the embodiments.

After the monolayer of the desired material, e.g., silicon nitride, has been formed, the deposition chamber 603 may be purged (leaving behind the monolayer of the desired material on the exposed surfaces of the second opening 505) using, e.g., a purge gas from the purge gas delivery system 614 for about three seconds. After the deposition chamber 603 has been purged, a first cycle for the formation of the desired material has been completed, and a second cycle similar to the first cycle may be started. For example, the repeated cycle may introduce the first precursor material, purge with the purge gas, pulse with the second precursor, and purge with the purge gas. These cycles may be repeated until the second dielectric layer 601 has a fourth thickness $T_4$ of between about 5 Å and about 50 Å. Once the desired thickness of the second dielectric layer 601 has been reached, the substrate 101 may be removed from the deposition chamber 603 for further processing.

However, as one of ordinary skill in the art will recognize, the above described process to form the second dielectric layer 601 is intended to be illustrative and is not intended to be limiting to the embodiments. Any other suitable process, such as initially pulsing the second precursor material (e.g., ammonia), purging with the purge gas, introducing the first precursor material (e.g., dichlorosilane), and purging with the purge gas to complete a first cycle and then repeating the first cycle, may be utilized. This and any other suitable process to form the second dielectric layer 601 are fully intended to be included within the scope of the embodiments.

Figure 7:
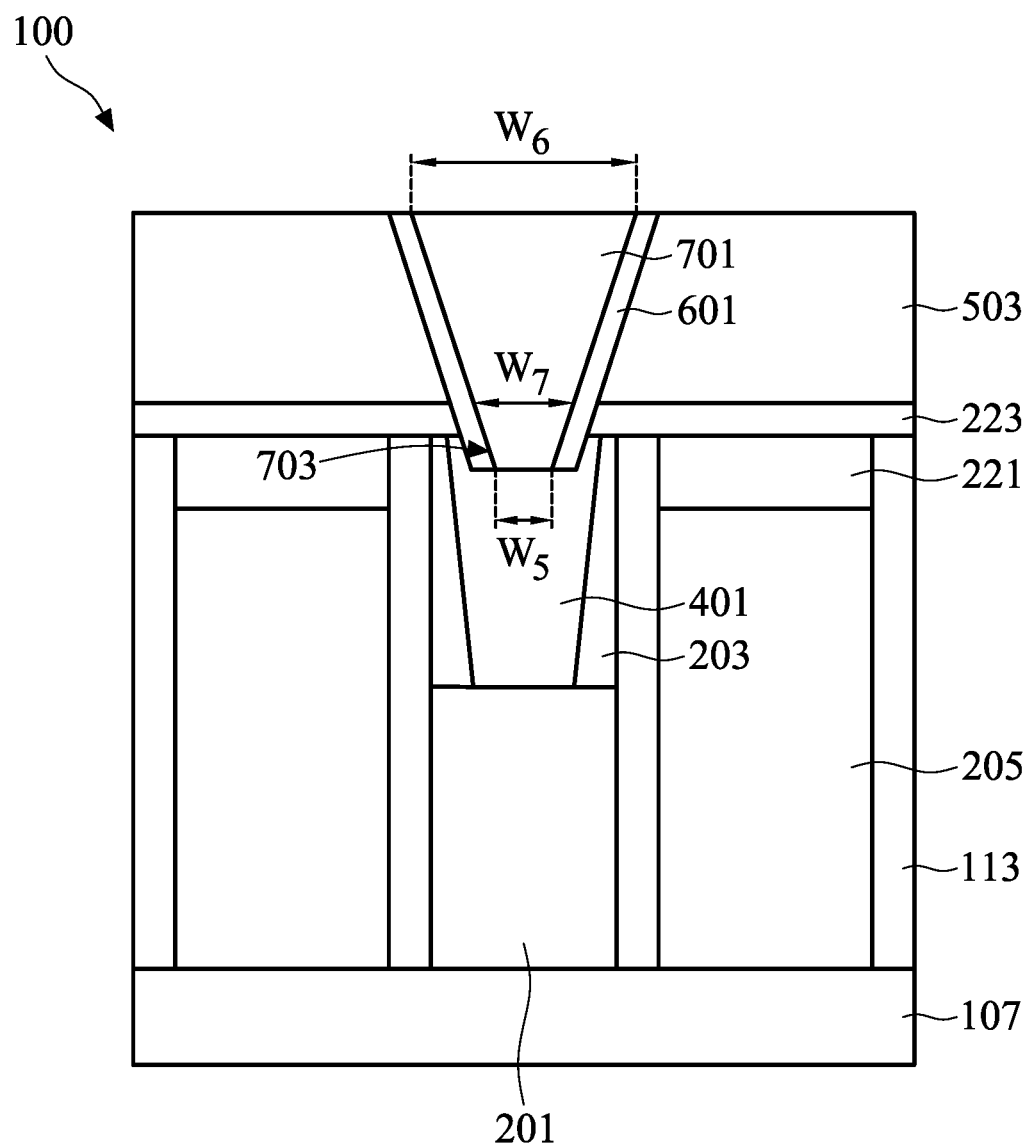
FIG. 7 illustrates a formation of a second contact in accordance with some embodiments.

FIG. 7 illustrates an opening of the second dielectric layer 601 in order to expose the underlying first contact 401 along with a formation of the second contact 701 in electrical connection with the first contact 401. In an embodiment the second dielectric layer 601 may be patterned by initially placing and patterning a third photoresist (not separately illustrated in FIG. 7) over the second dielectric layer 601. In an embodiment the third photoresist is similar to the first photoresist 301 (described above with respect to FIG. 3) and may be placed and patterned in a similar fashion. For example, the third photoresist may be a tri-layer photoresist that is exposed with a patterned energy in order to pattern the third photoresist. The third photoresist may then be developed.

Once the third photoresist has been patterned, the pattern of the third photoresist may be transferred to the second dielectric layer 601 using the third photoresist as a mask. In an embodiment the second dielectric layer 601 may be patterned using a third etching process, which may be an anisotropic etching process such as a reactive ion etch process to form a third opening 703 through the second dielectric layer 601, the third opening 703 having a fifth width $W_5$ that is greater than the second width $W_2$ (e.g., a ratio of the fifth width $W_5$ to the second width $W_2$ is less than 1). In a particular embodiment the fifth width $W_5$ may be between about 3 nm and about 20 nm. However, any suitable process, such as a wet etching process, and any suitable reactants or dimensions may be used.

In another embodiment the third opening 703 may be formed without the use of a photoresist. In this embodiment the third opening 703 is formed by performing the third etching process to remove the horizontal portions of the second dielectric layer 601 while the vertical portions protect the underlying portions of the second dielectric layer 601. As such, portions of the second dielectric layer 601 along the sidewalls of the second opening 505 remain. However, any suitable process of forming the third opening 703 may be utilized.

Once the first contact 401 has been exposed, a conductive material may be deposited to fill and/or overfill the second opening 505 and the third opening 703 to make electrical connection with the first contact 401. In an embodiment the second contact 701 may be a conductive material such as tungsten (W), although any suitable material, such as aluminum, copper, alloys of these, combinations of these, or the like, and may be deposited using a deposition process such as sputtering, chemical vapor deposition, electroplating (with a seed layer), electroless plating, or the like, to fill and/or overfill the second opening 505.

Once filled or overfilled, any deposited material outside of the second opening 505 may be removed using a planarization process such as chemical mechanical polishing (CMP).

Such a process may also be used to remove any material of the second dielectric layer 601 that is located outside of the second opening 505, thereby planarizing the second dielectric layer 601 and the second contact 701. By planarizing the conductive material, the second contact 701 may have a sixth width $W_6$ at the top of the second contact 701 that is greater than the fifth width $W_5$ (e.g., a ratio of $W_6$ to $W_5$ is greater than 1). In a particular embodiment the sixth width $W_6$ may be between about 5 nm and about 35 nm. Additionally, the second contact 701 may have a seventh width $W_7$ at a point adjacent to a top surface of the first etch stop layer 223 of between about 3 nm and about 30 nm. However, any suitable widths may be used.

In a particular embodiment a ratio between the fourth width $W_4$ and the seventh width $W_7$ is greater than 1 and a ration between the second width $W_2$ and the seventh width $W_7$ is greater than 1. Additionally, the fourth width $W_4$ may be larger than the second width $W_2$, the second width $W_2$ may be larger than the sixth width $W_6$, the sixth width $W_6$ may be larger than the seventh width $W_7$, and the seventh width $W_7$ may be larger than the second width $W_2$. However, any suitable dimensions may be utilized.

Once the second contact 701 has been formed, the semiconductor device 100 is ready for additional processing. In some embodiments the additional processing may include forming one or more metallization layers over the second contact 701 in order to form functional circuitry, forming contact pads in electrically connection with the metallization layer, and packaging the semiconductor device 100 so that the semiconductor device 100 may be attached to other external devices.

By adding the second dielectric film prior to the metal zero (M0) to oxide definition (OD) (MD) etch process, the overall size of the device may be reduced. Additionally, there is less lithography and etching process loading, fewer lithographic overlay requirements, and less pattern loading along with a strong isolation for the channel. All of this can lead to a better device and Cp yield performances, along with an enlarged reliability and leakage window and a better MD process window and inline control in the finFET process.

Figure 8A:
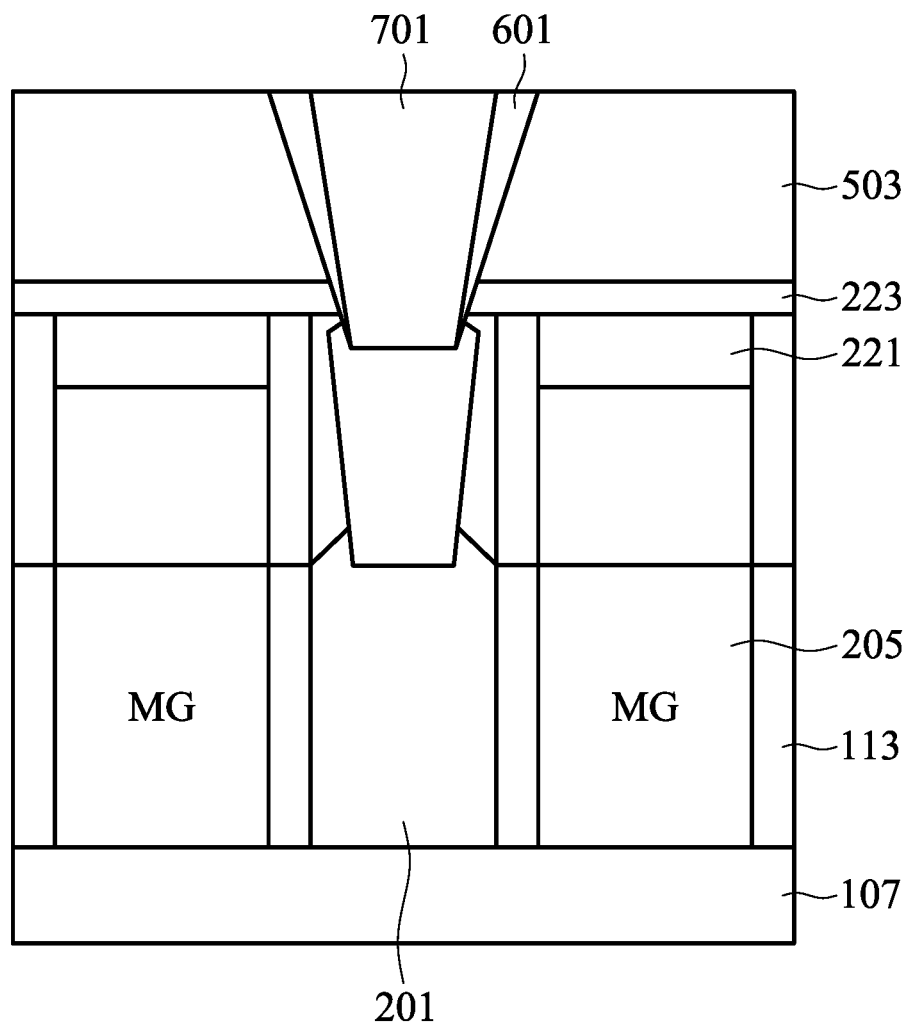
FIGS. 8A-8C illustrate tuned contacts in accordance with some embodiments.
Figure 8B:
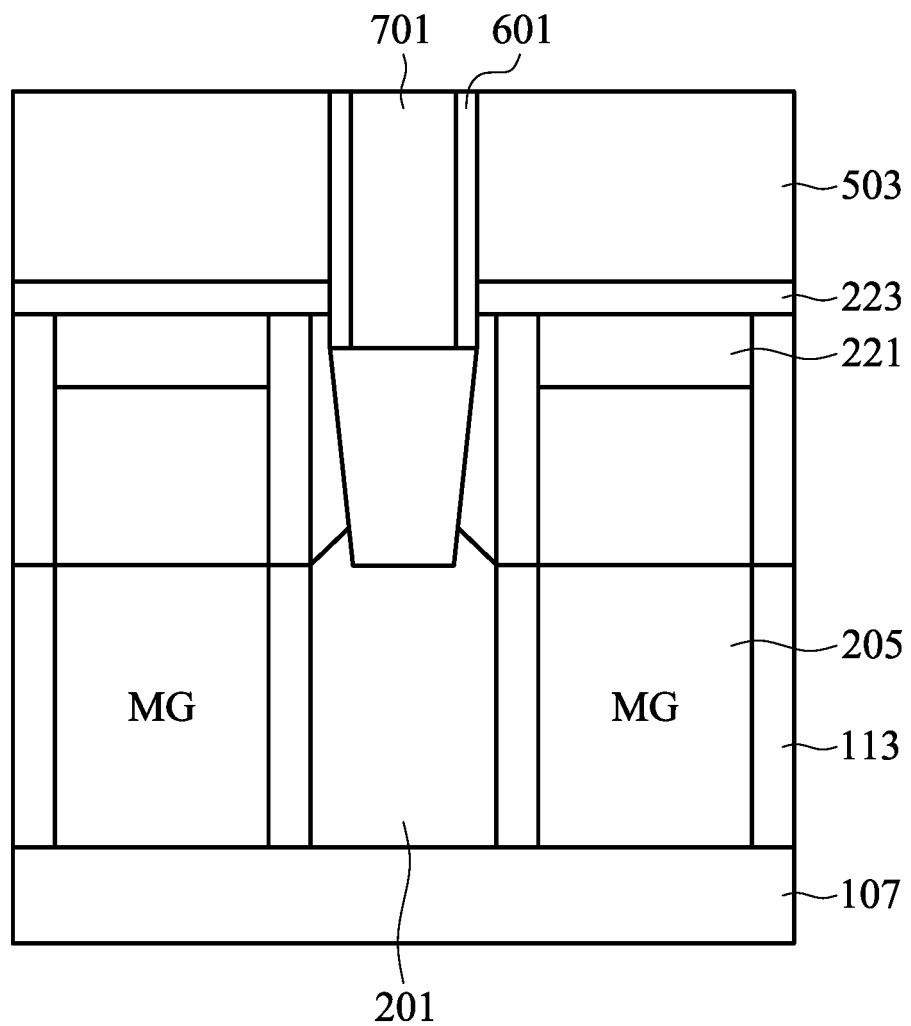
Figure 8C:
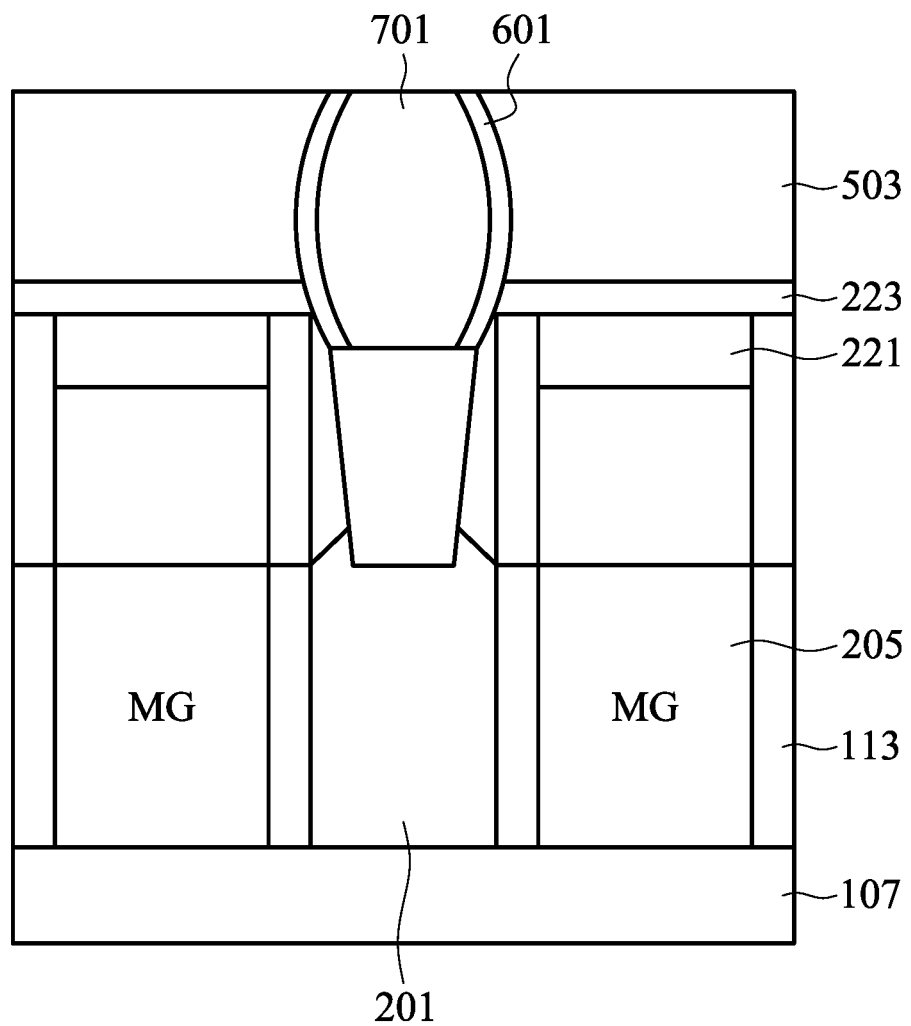

FIGS. 8A-8C illustrate further embodiments in which there is a multi-step contact profile that does not have a metal gate seam. Looking first at FIG. 8A, in this embodiment the second opening 505 and the second dielectric layer 601, instead of being almost completely conformal (as illustrated above with respect to FIG. 7), have a tapered shape as the second dielectric layer 601 moves towards the fin 107. In a particular embodiment the second dielectric layer 601 has the fourth thickness $T_4$ at the top of the second opening 505 but, as the second dielectric layer 601 moves along the sidewalls of the second opening 505 towards the fin 107, the thickness of the second dielectric layer 601 will reduce until it is either zero or close to zero at the bottom of the second opening.

In order to form the second opening 505 with the tapered shape, the second etching process 509 may be performed with a bias of between about 500 and about 700 and at a pressure of about 10 mTorr. In an alternative embodiment, the gate stacks 205 may have a first pitch $P_1$ that is tuned in order to help form the tapered shape. In this embodiment the first pitch $P_1$ may be tuned to be greater than about 100 nm. However, any suitable method or parameters may be used to form the second opening 505 with the tapered shape.

Looking next at FIG. 8B, in this embodiment the second opening 505, instead of being tapered and having sloping sidewalls (as illustrated above with respect to FIG. 7), have a vertical shape. In a particular embodiment the sidewalls of the second opening 505 are either perpendicular with the fin 107 or else almost perpendicular with the fin 107. As such, the sidewalls of the second contact 701 will also be perpendicular or almost perpendicular with the fin 107.

In order to form the second opening 505 with the vertical sidewalls, the second etching process 509 may be performed with a bias of greater than about 800 W and at a pressure of between about 5 mTorr and about 8 mTorr. In an alternative embodiment, the gate stacks 205 may have a first pitch $P_1$ that is tuned in order to help form the vertical shape. In this embodiment the first pitch $P_1$ may be tuned to be between about 30 nm and about 100 nm. However, any suitable method or parameters may be used to form the second opening 505 with the vertical sidewalls shape.

Looking at FIG. 8C, in this embodiment the second opening 505, instead of being either tapered or perpendicular, has a bottle shape. In order to form the second opening 505 with the bottle shape, the second etching process 509 may be performed with a bias of greater than about 800 W and at a pressure of between about 5 mTorr and about 8 mTorr. Additionally, an overetch is performed. For example, in an embodiment in which the vertical sidewalls are formed first, the overetch may be performed for a time period that is 30% larger than the time to form the vertical sidewalls. In an alternative embodiment, the gate stacks 205 may have a first pitch $P_1$ that is tuned in order to help form the bottle shape. In this embodiment the first pitch $P_1$ may be tuned to be less than about 30 nm. However, any suitable method or parameters may be used to form the second opening 505 with the bottle shape.

Figure 9A:
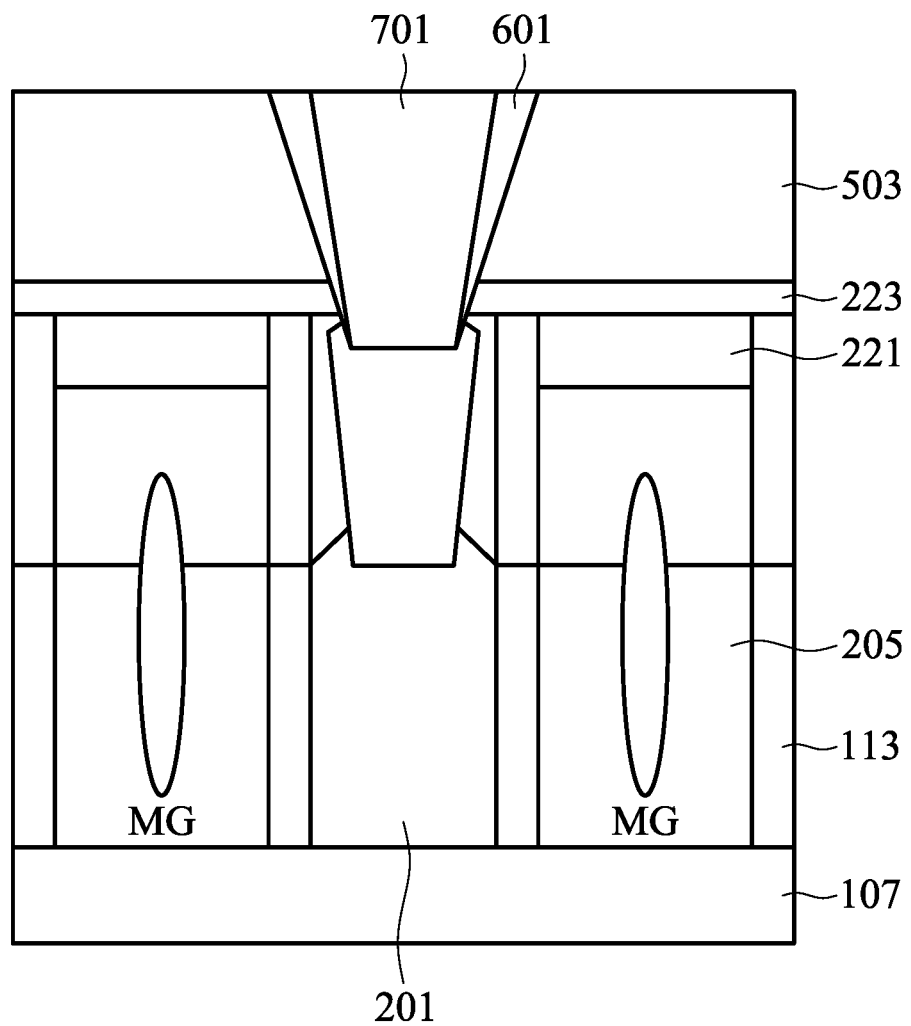
FIGS. 9A-9C illustrate a formation of a seam in accordance with some embodiments.
Figure 9B:
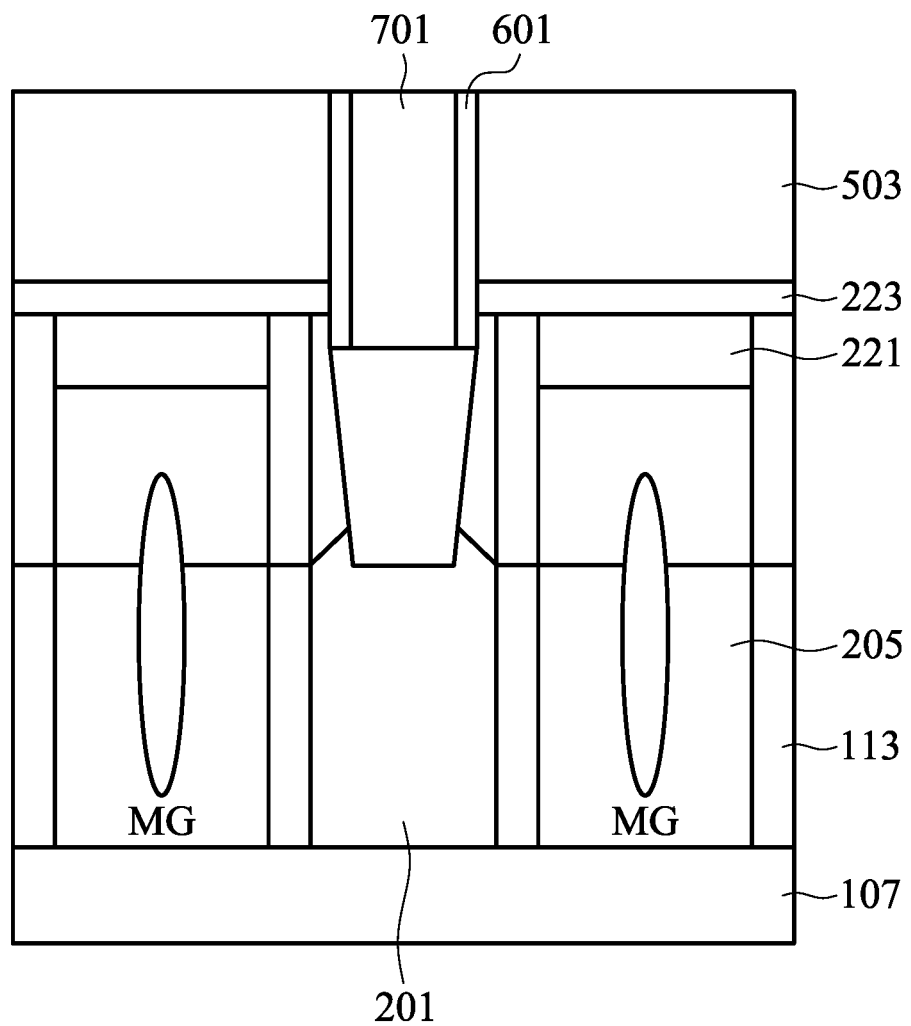
Figure 9C:
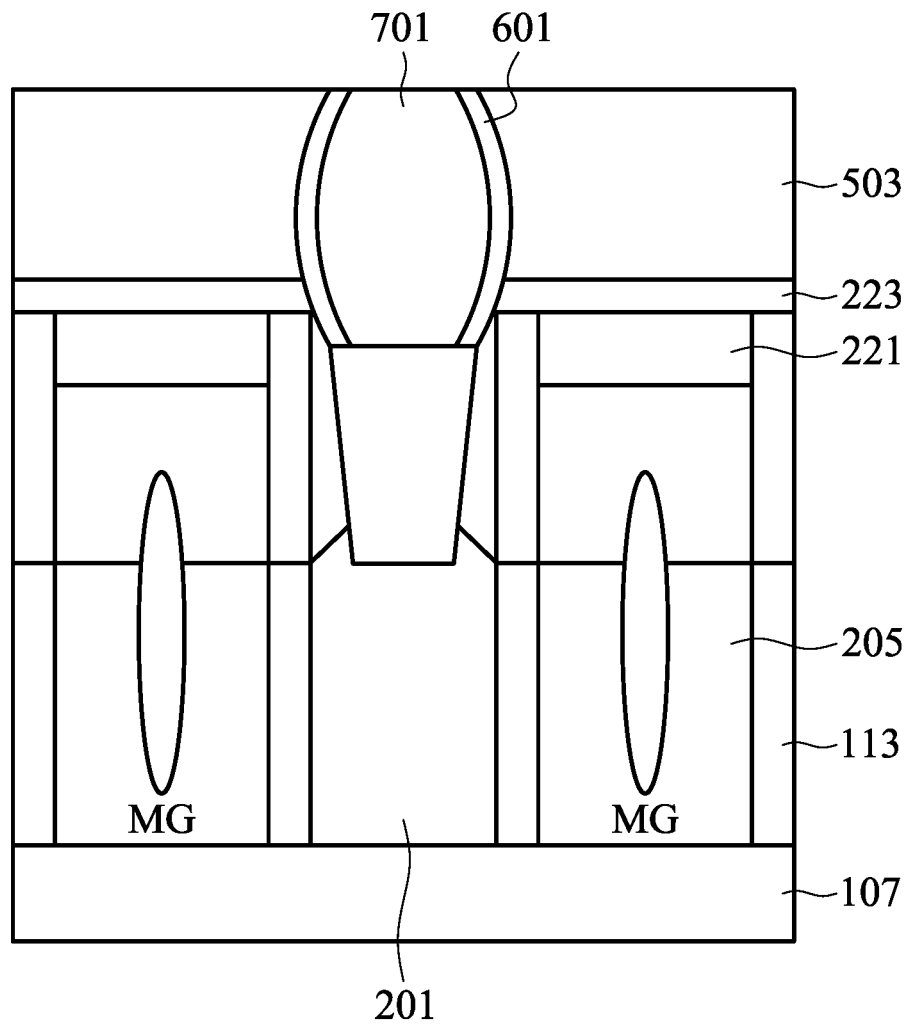

FIGS. 9A-9C illustrate additional embodiments similar to the embodiments described above with respect to FIGS. 8A-8C. In these embodiments, rather than have a seamless gate stack 205, the gate stack 205 comprises a seam 901 or void within the material of the gate stack 205. For example, as illustrated in FIG. 9A, there may be a tapered second dielectric layer 601 (as described above with respect to FIG. 8A) along with a gate stack 205 that incorporates the seam 901. As another example, there may be a second opening 505 with vertical sidewalls (as described above with respect to FIG. 8B) that incorporates the seam 901. As yet another example, there may be a second opening 505 with a bottle shape (as described above with respect to FIG. 8C) that incorporates the seam 901. Any embodiment described herein may also incorporate the seam 901 within the material of the dummy gate electrode 111.

The seam 901 is formed during the deposition process for the third metal material 217 within the gate stack 205 when the gate width is small for a short-channel device and a non-conformal deposition process is utilized. In a particular embodiment to obtain the formation of the seam, a non-conformal deposition process such as chemical vapor deposition or physical vapor deposition is utilized on a device wherein the gate width is equal to or less than 15 nm.

Figure 10A:
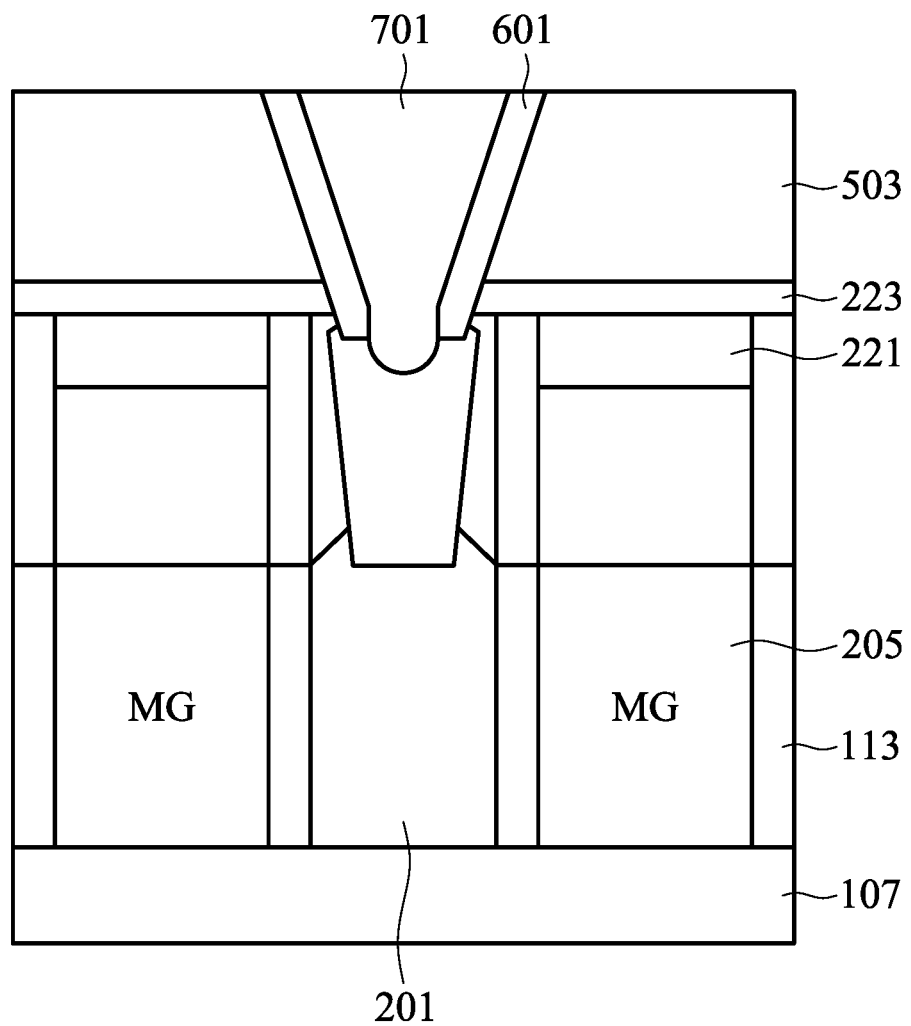
FIGS. 10A-10C illustrate tuned bottom surfaces in accordance with some embodiments.
Figure 10B:
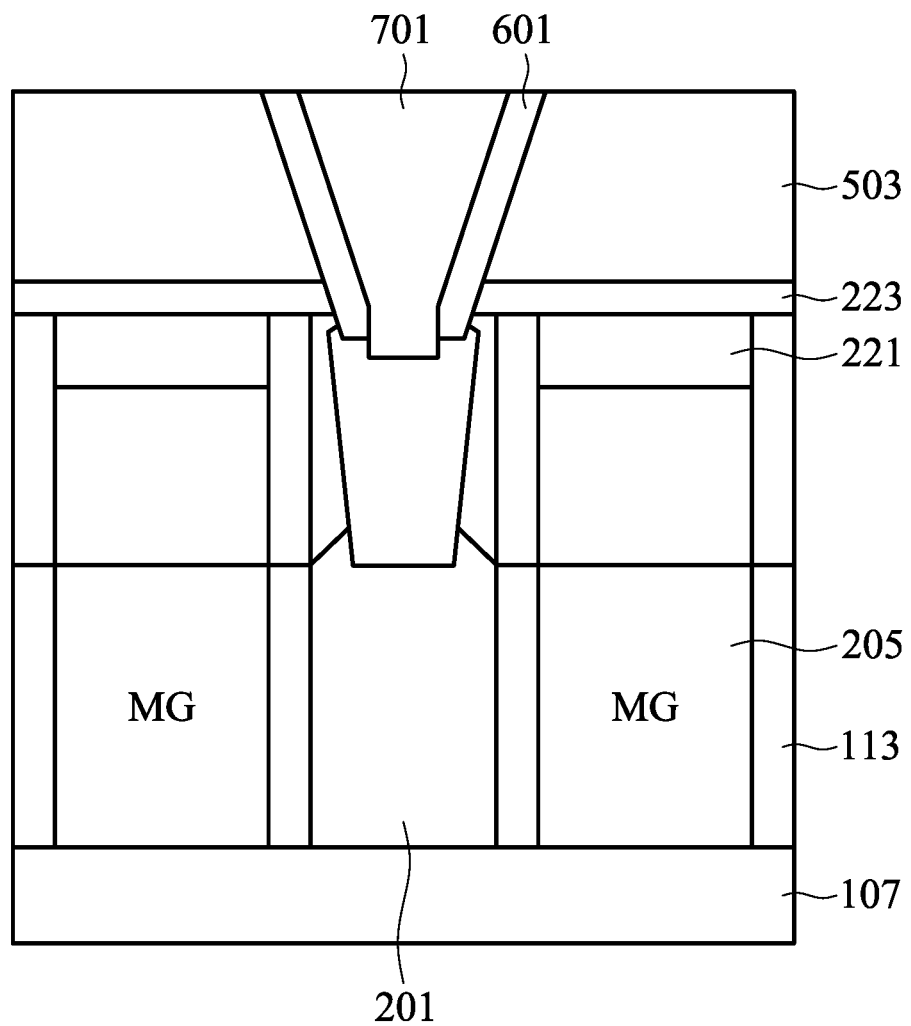
Figure 10C:
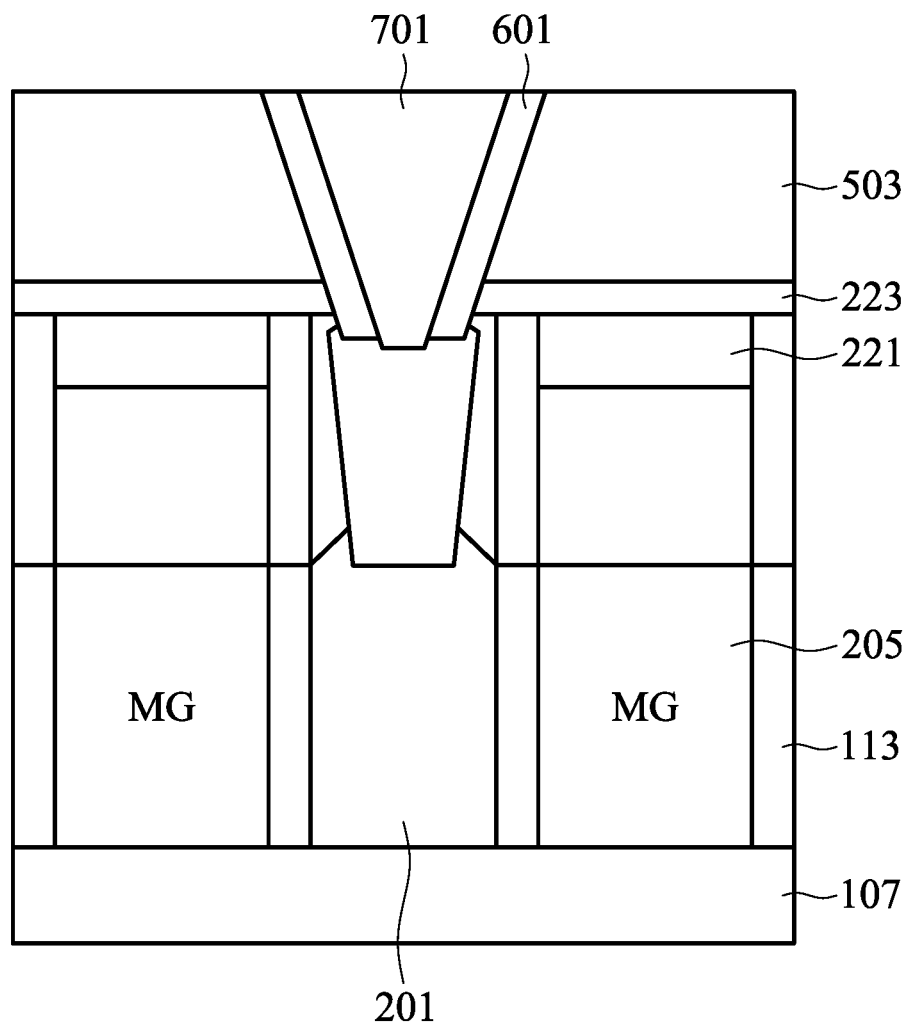

FIGS. 10A-10C illustrate further embodiments in which the profile of the second contact 701 where it comes into physical contact with the first contact 401 is tailored. In the embodiment illustrates in FIG. 10A, which illustrates a second opening 505 that has tapered sidewalls, the profile of the second contact 701 may comprise first sidewalls that are perpendicular with the fin 107 or almost perpendicular with the fin 107. Additionally, the first sidewalls are joined together by a bottom surface of the second contact 701 that has a concave shape as it extends between the first sidewalls In an embodiment the shape of the bottom surface of the second contact 701 is formed with an overetch of the third etching process (used to punch through the second dielectric layer 601). In a particular embodiment the overetch is performed for a time that is greater than 30% of the time to punch through the second dielectric layer 601. However, any suitable process to form the shape may be utilized.

FIG. 10B illustrates another embodiment in which the second contact 701 has first sidewalls which are perpendicular with the fin 107. In this embodiment, however, rather than the bottom surface having a concave shape (as described above with respect to FIG. 10A), the bottom surface is planar as it extends between the first sidewalls.

In an embodiment the shape of the bottom surface of the second contact 701 as illustrated in FIG. 10B is formed with an overetch of the third etching process (used to punch through the second dielectric layer 601) along with a high bias and a low pressure (e.g., about 5 mTorr to about 8 mTorr). In a particular embodiment the overetch is performed for a time that is greater than 30% of the time to punch through the second dielectric layer 601. However, any suitable process to form the shape may be utilized.

FIG. 10C illustrates another embodiment in which the bottom surface of the second contact 701 is planar as it extends between the first sidewalls. In this embodiment, however, rather than the first sidewalls being perpendicular to the fin 107, the first sidewalls are tapered such that they are not perpendicular with the fin 107. In this embodiment the third etching process is performed without an overetch.

Figure 11A:
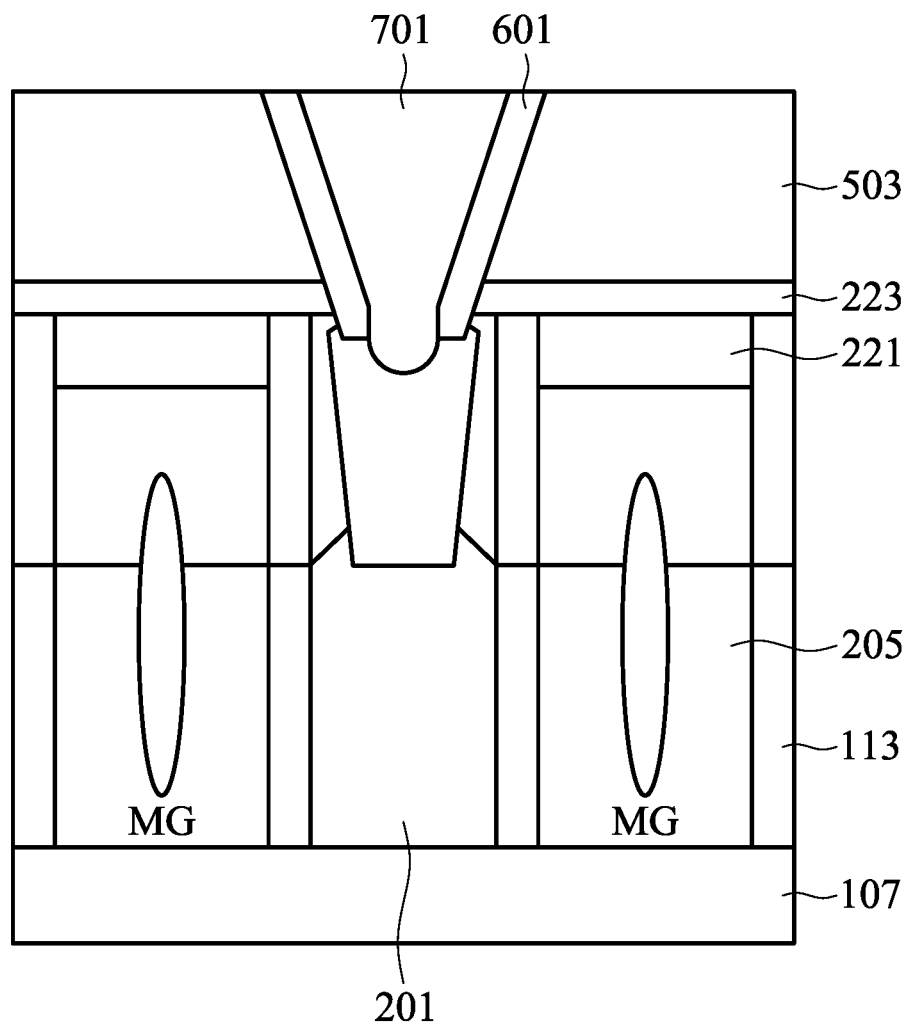
FIGS. 11A-11C illustrate a formation of a seam in accordance with some embodiments.
Figure 11B:
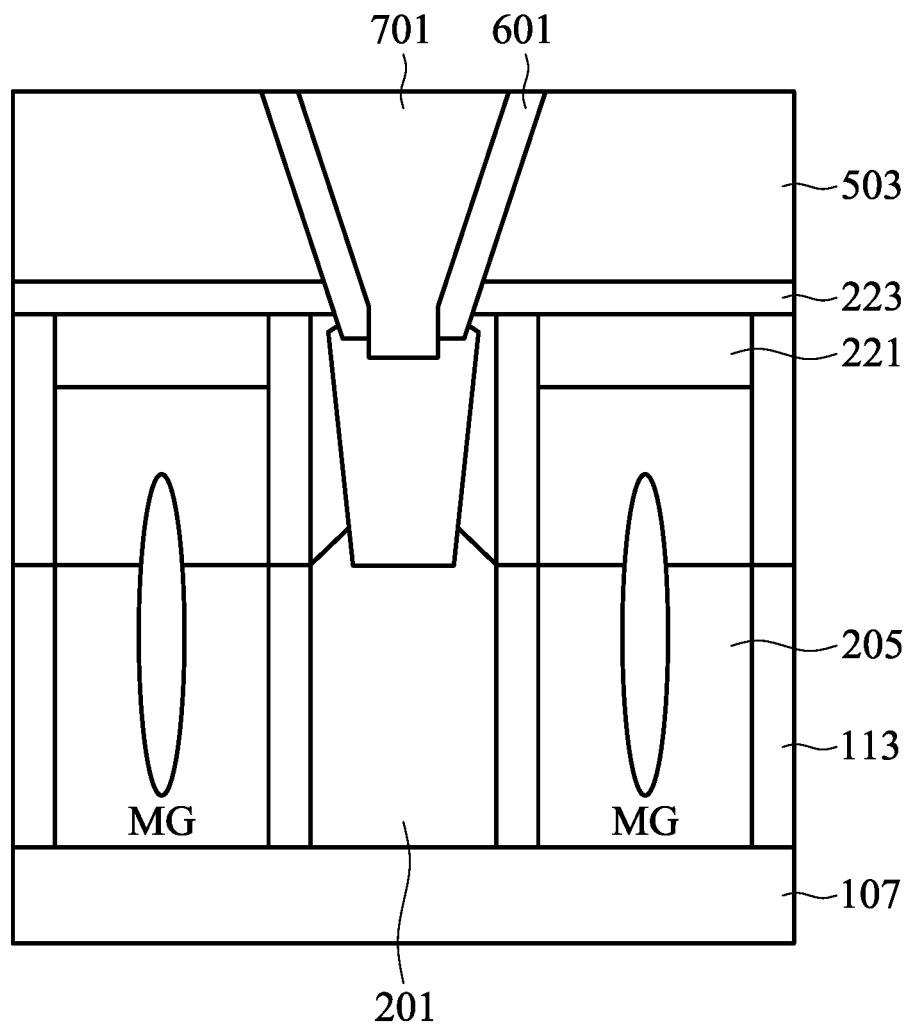
Figure 11C:
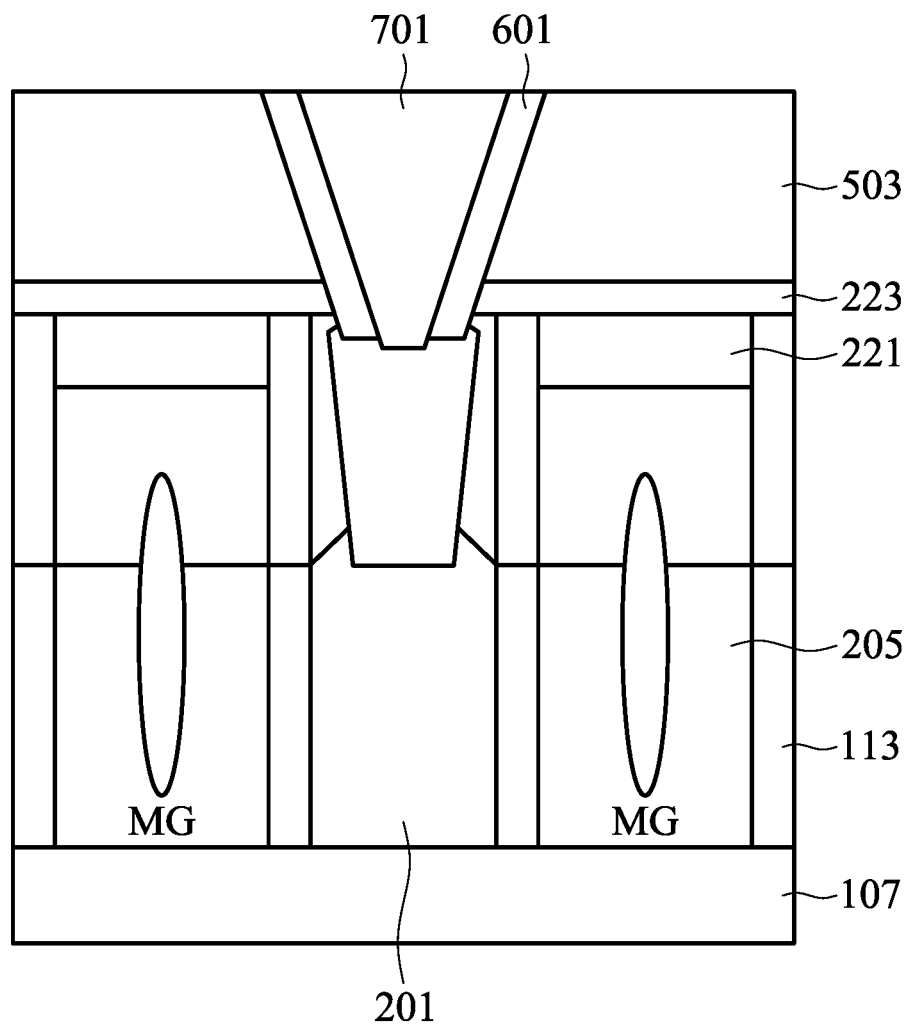

FIGS. 11A-11C illustrate additional embodiments from those described in FIGS. 10A-10C, respectively. In particular, FIGS. 11A-11C illustrates embodiments in which the material of the dummy gate electrode 111 illustrated in FIGS. 10A-10C incorporates the seam 901. In an embodiment the seam 901 may be similar to and made using a similar process as described above with respect to FIGS. 9A-9C. However, any suitable process of forming the seam 901 or void within the material of the dummy gate electrode 111 may be utilized.

By utilizing the embodiments described herein, the lithographic and etching process loading may be reduced, and there is a smaller overlay requirement. Additionally, there is less pattern loading there is a strong isolation for the channel. All of this leads to a better device and yield performance with an enlarged reliability/leakage window that allows for a better process window and inline control in finFET processes.

In an embodiment, a device includes: a fin extending from a substrate; a first transistor including a first channel region in the fin, a first gate stack over the first channel region, and a source/drain region adjacent to the first gate stack; a second transistor including a second channel region in the fin, a second gate stack over the second channel region, and the source/drain region; a first dielectric layer over the source/drain region, the first gate stack, and the second gate stack; a first contact extending through the first dielectric layer, the first contact being electrically connected to the source/drain region; and a dielectric liner surrounding the first contact, the dielectric liner physically separating the first contact from the first dielectric layer.

In some embodiments of the device, the dielectric liner has a thickness of greater than 0.5 nm. In some embodiments, the device further includes: a second dielectric layer disposed between the first dielectric layer and the source/drain region; and a second contact extending through the second dielectric layer, the second contact being physically and electrically connected to the first contact and the source/drain region. In some embodiments of the device, the dielectric liner includes different materials than the first dielectric layer and the second dielectric layer. In some embodiments of the device, the first contact and the second contact share an interface, the first contact having a first width at the interface, the second contact having a second width at the interface, the second width being greater than the first width. In some embodiments, the device further includes: an etch stop layer between the first dielectric layer and the second dielectric layer, the first contact extending through the etch stop layer. In some embodiments of the device, the first transistor further includes a first spacer disposed between the first gate stack and the source/drain region, the second transistor further includes a second spacer disposed between the second gate stack and the source/drain region, and top surfaces of the first spacer, the second spacer, the second dielectric layer, and the second contact are level. In some embodiments of the device, top surfaces of the first dielectric layer, the first contact, and the dielectric liner are level.

In an embodiment, a method includes: forming a fin extending from a substrate; forming a gate stack on the fin; forming a source/drain region adjacent to the gate stack; forming a first contact to the source/drain region; depositing a dielectric layer having a first portion over the first contact and a second portion over the gate stack; forming an opening through the first portion of the dielectric layer; depositing a dielectric liner along sidewalls and a bottom of the opening; removing a portion of the dielectric liner along the bottom of the opening to expose the first contact, the gate stack remaining covered by the second portion of the dielectric layer after removing the portion of the dielectric liner; and filling the opening with a conductive material to form a second contact to the first contact.

In some embodiments of the method, the depositing the dielectric liner includes: pulsing a first precursor into contact with the sidewalls of the opening; purging the first precursor; and after the purging the first precursor, pulsing a second precursor into contact with a product of the first precursor along the sidewalls of the opening. In some embodiments of the method, the depositing the dielectric liner further includes: repeating the pulsing the first precursor and the pulsing the second precursor until the dielectric liner has a thickness of greater than 0.5 nm. In some embodiments of the method, the removing the portion of the dielectric liner includes: etching the dielectric liner to remove horizontal portions of the dielectric liner, remaining vertical portions of the dielectric liner being disposed in the opening. In some embodiments of the method, the removing the portion of the dielectric liner includes: forming a photoresist over the dielectric layer; patterning the photoresist to expose portions of the dielectric liner along the bottom of the opening; and etching the dielectric liner using the photoresist as an etching mask. In some embodiments of the method, the dielectric liner is further deposited over top surfaces of the dielectric layer, and filling the opening with the conductive material includes: overfilling the opening with the conductive material; and planarizing the conductive material and the dielectric liner to remove portions of the conductive material and the dielectric liner outside of the opening. In some embodiments, the method further includes: depositing a etch stop layer over the first contact and the gate stack, the dielectric layer being deposited over the etch stop layer. In some embodiments, the method further includes: extending the opening through the etch stop layer to expose the first contact.

In an embodiment, a method includes: forming a first transistor including a first gate structure, a first source/drain region, and a second source/drain region; forming a second transistor including a second gate structure, the first source/drain region, and a third source/drain region; forming a first contact to the first source/drain region; forming a first dielectric layer over the first gate structure and the second gate structure; patterning the first dielectric layer to form a first opening through the first dielectric layer, the first opening exposing the first contact; lining sidewalls of the first opening with a dielectric liner; and filling a remainder of the first opening with a conductive material to form a second contact, the second contact extending through the dielectric liner to make contact with the first contact, the dielectric liner physically separating the second contact from the first gate structure and the second gate structure.

In some embodiments of the method, the lining the sidewalls of the first opening with the dielectric liner includes: depositing the dielectric liner with an atomic layer deposition process to a thickness of greater than 0.5 nm. In some embodiments of the method, the lining the sidewalls of the first opening with the dielectric liner further includes: etching the dielectric liner to remove portions of the dielectric liner along a bottom of the first opening. In some embodiments of the method, the first contact is etched during the etching of the dielectric liner, the dielectric liner being etched for a first time period, the first contact being etched for a second time period, the second time period being 30% larger than first time period.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a fin extending from a substrate;
   a first transistor comprising a first channel region in the fin, a first gate stack over the first channel region, and a source/drain region adjacent to the first gate stack;
   a second transistor comprising a second channel region in the fin, a second gate stack over the second channel region, and the source/drain region;
   a first dielectric layer over the source/drain region, the first gate stack, and the second gate stack;
   a first contact extending through the first dielectric layer, the first contact being electrically connected to the source/drain region;
   a dielectric liner surrounding the first contact, the dielectric liner physically separating the first contact from the first dielectric layer;
   a second dielectric layer disposed between the first dielectric layer and the source/drain region; and
   a second contact extending through the second dielectric layer, the second contact being physically and electrically connected to the first contact and the source/drain region, wherein the first contact and the dielectric liner each extend into the second contact.

2. The device of claim 1, wherein the dielectric liner has a thickness of greater than 0.5 nm.

3. The device of claim 1, wherein the dielectric liner comprises different materials than the first dielectric layer and the second dielectric layer.

4. The device of claim 1, wherein the first contact and the second contact share an interface, the first contact having a first width at the interface, the second contact having a second width at the interface, the second width being greater than the first width.

5. The device of claim 1, further comprising:
   an etch stop layer between the first dielectric layer and the second dielectric layer, the first contact extending through the etch stop layer.

6. The device of claim 1, wherein the first transistor further comprises a first spacer disposed between the first gate stack and the source/drain region, wherein the second transistor further comprises a second spacer disposed between the second gate stack and the source/drain region, and wherein top surfaces of the first spacer, the second spacer, the second dielectric layer, and the second contact are level.

7. The device of claim 1, wherein top surfaces of the first dielectric layer, the first contact, and the dielectric liner are level.

8. A device comprising:
   a fin extending from a substrate;
   a first gate stack over a first channel region of the fin;
   a second gate stack over a second channel region of the fin;
   a source/drain region in the fin, the source/drain region adjoining the first channel region and the second channel region;
   a first contact over the source/drain region, the first contact being physically and electrically connected to the source/drain region;
   a first dielectric layer over the first contact, the first gate stack, and the second gate stack;
   a second contact extending through the first dielectric layer and into the first contact, the second contact being physically and electrically connected to the first contact; and
   a dielectric liner surrounding the second contact, the dielectric liner physically separating the second contact from the first dielectric layer, the dielectric liner extending into the first contact.

9. The device of claim 8, wherein the dielectric liner has tapered sidewalls, a width of the tapered sidewalls decreasing in a direction extending from a top surface of the second contact to a bottom surface of the second contact.

10. The device of claim 9, wherein the first gate stack comprises a first void disposed therein, and the second gate stack comprises a second void disposed therein.

11. The device of claim 8 further comprising:
    a second dielectric layer surrounding the first contact; and
    an etch stop layer disposed between the first dielectric layer and the second dielectric layer, a combined height of the etch stop layer and the first dielectric layer being less than a height of the second contact.

12. The device of claim 11, wherein the height of the second contact is greater than a height of the dielectric liner.

13. A device comprising:
    a fin extending from a substrate;
    a gate stack over the fin;
    a source/drain region adjacent the gate stack;
    a first contact physically connected to the source/drain region;
    a first dielectric layer over the first contact and the gate stack;

a second contact extending through the first dielectric layer and into the first contact, the second contact having a single bottom surface facing the substrate, the bottom surface of the second contact being physically connected to the first contact; and a dielectric liner surrounding the second contact, the dielectric liner physically separating the second contact from the first dielectric layer, the dielectric liner extending into the first contact, the second contact extending further into the first contact than the dielectric liner.

14. The device of claim 13, wherein the second contact has first sidewalls joined together by the bottom surface of the second contact, the bottom surface of the second contact having a concave shape as it extends between the first sidewalls.

15. The device of claim 14, wherein the gate stack comprises a void disposed therein.

16. The device of claim 13, wherein the second contact has first sidewalls joined together by the bottom surface of the second contact, the first sidewalls being perpendicular to a longitudinal axis of the fin, the bottom surface of the second contact being planar as it extends between the first sidewalls.

17. The device of claim 16, wherein the gate stack comprises a void disposed therein.

18. The device of claim 13, wherein the second contact has first sidewalls joined together by the bottom surface of the second contact, the first sidewalls being tapered, the bottom surface of the second contact being planar as it extends between the first sidewalls.

19. The device of claim 18, wherein the gate stack comprises a void disposed therein.

20. The device of claim 1, wherein the first contact extends further into the second contact than the dielectric liner.

* * * * *